United States Patent
Kamino et al.

(10) Patent No.: US 11,728,098 B2
(45) Date of Patent: Aug. 15, 2023

(54) METHOD OF DEPOSITING A PEROVSKITE MATERIAL

(71) Applicant: OXFORD PHOTOVOLTAICS LIMITED, Oxfordshire (GB)

(72) Inventors: Brett Akira Kamino, Oxfordshire (GB); Laura Miranda Perez, Oxfordshire (GB)

(73) Assignee: OXFORD PHOTOVOLTAICS LIMITED, Oxfordshire (GB)

( * ) Notice: Subject to any disclaimer, the term of this patent is extended or adjusted under 35 U.S.C. 154(b) by 0 days.

(21) Appl. No.: 15/735,740

(22) PCT Filed: Jun. 10, 2016

(86) PCT No.: PCT/GB2016/051743
§ 371 (c)(1),
(2) Date: Dec. 12, 2017

(87) PCT Pub. No.: WO2016/198897
PCT Pub. Date: Dec. 15, 2016

(65) Prior Publication Data
US 2018/0174761 A1 Jun. 21, 2018

(30) Foreign Application Priority Data
Jun. 12, 2015 (GB) .................................. 1510351

(51) Int. Cl.
*H01G 9/20* (2006.01)
*C23C 18/12* (2006.01)
(Continued)

(52) U.S. Cl.
CPC ....... *H01G 9/2009* (2013.01); *C23C 18/1204* (2013.01); *H01G 9/0036* (2013.01);
(Continued)

(58) Field of Classification Search
CPC ................ H01G 9/2009; H01G 9/0036; H01L 31/02363; H01L 31/0725; H01L 51/4213;
(Continued)

(56) References Cited

U.S. PATENT DOCUMENTS

| | | | |
|---|---|---|---|
| 10,157,710 B2 * | 12/2018 | Jones | C23C 14/14 |
| 2011/0277827 A1 * | 11/2011 | Yang | C23C 14/34 |
| | | | 136/255 |
| 2018/0019360 A1 * | 1/2018 | Mishima | H01L 27/301 |

FOREIGN PATENT DOCUMENTS

| | | |
|---|---|---|
| CN | 104393109 | 3/2015 |
| WO | 2013/171517 A1 | 11/2013 |

(Continued)

OTHER PUBLICATIONS

Schneider et al., "Pyramidal surface textures for light trapping and antireflection in perovskite-on-silicon tandem solar cells", Optics Express, vol. 22, No. S6, All Pages. (Year: 2014).*

(Continued)

*Primary Examiner* — Daniel P Malley, Jr.
(74) *Attorney, Agent, or Firm* — Meunier Carlin & Curfman LLC

(57) ABSTRACT

There is provided a method of producing a photovoltaic device comprising a photoactive region comprising a layer of perovskite material, wherein the layer of perovskite material is disposed on a surface that has a roughness average ($R_a$) or root mean square roughness ($R_{rms}$) of greater than or equal to 50 nm. The method comprises using vapour deposition to deposit a substantially continuous and conformal solid layer comprising one or more initial precursor compounds of the perovskite material, and subsequently treating the solid layer with one or more further precursor compounds to form a substantially continuous and conformal solid layer of the perovskite material on the rough surface. There is also provided a photovoltaic device com- (Continued)

prising a photoactive region comprising a layer of perovskite material disposed using the method.

16 Claims, 8 Drawing Sheets

(51) Int. Cl.
      *H10K 30/87*     (2023.01)
      *H10K 30/15*     (2023.01)
      *H10K 71/16*     (2023.01)
      *H01G 9/00*      (2006.01)
      *H01L 31/0236*   (2006.01)
      *H01L 31/0725*   (2012.01)
      *H01L 31/074*    (2012.01)
      *H10K 102/10*    (2023.01)
      *H01L 31/0256*   (2006.01)
(52) U.S. Cl.
    CPC ...... *H01L 31/02363* (2013.01); *H01L 31/074* (2013.01); *H01L 31/0725* (2013.01); *H10K 30/151* (2023.02); *H10K 30/87* (2023.02); *H10K 71/164* (2023.02); *H01L 2031/0344* (2013.01); *H10K 2102/103* (2023.02); *Y02E 10/549* (2013.01); *Y02P 70/50* (2015.11)
(58) Field of Classification Search
    CPC . H01L 51/422; H01L 51/4226; H01L 51/424; H01L 51/4253; H01L 31/0236; H01L 31/02366
    See application file for complete search history.

(56) References Cited

FOREIGN PATENT DOCUMENTS

| | | |
|---|---|---|
| WO | 2014/045021 A1 | 3/2014 |
| WO | WO-2014045021 A * | 3/2014 |
| WO | 2015/017885 A1 | 2/2015 |
| WO | 2016/094966 A1 | 6/2016 |

OTHER PUBLICATIONS

STN search conducted by the Examiner. All Pages. 2020. (Year: 2020).*
Filipic et al., "CH3NH3PbI3 perovskite / silicon tandem solar cells: characterization based optical simulations", Optics Express, vol. 23, No. 7, All Pages, Feb. 27, 2015. (Year: 2015).*
Nikita Gupta et al., Highly Conformal Ni Micromesh as a Current Collecting Front Electrode for Reduced Cost Si Solar Cell, 9 ACS Appl. Material & Interfaces 8634, 8637 (Feb. 17, 2017).*
Schneider et al. "Pyramidal surface textures for light trapping and antireflection in perovskite-on-silicon tandem solar cells", Optics Express, vol. 22, No. S6, 2014, All Pages. (Year: 2014).*
Kojima, A et al. "Organometal Halide Perovskites as Visible-Light Sensitizers for Photovoltaic Cells", J. Am. Chem. Soc. 2009,131(17), pp. 6050-6051.
Lee, M. et al. "Efficient Hybrid Solar Cells Based on Meso-Superstructured Organometal Halide Perovskites", Sciencexpress, 338(6107), pp. 643-647, Oct. 4, 2012.
Coutts, T. et al. "Modeled performance of polycrystalline thin-film tandem solar cells", Progress in Photovoltaics: Research and Applications, 10(3), pp. 195-203, May 2002.
Noh, J. et al. "Chemical Management for Colorful, Efficient, and Stable Inorganic-Organic Hybrid Nanostructured Solar Cells" Nano Letters, 2013.
Rouquerol, J. et al. "Recommendations for the characterization of porous solids", Pure and Applied Chemistry, 66(8), pp. 1739-1758, 1994.
Haber, J. "Manual on catalyst characterization", Pure and Applied Chemistry, 63(9), IUPAC documents, pp. 1227-1246, 1991.
Peumans, P. et al. "Small molecular weight organic thin-film photodetectors and solar cells", Appl. Phys. 93(7), pp. 3693-3723, Apr. 1, 2003.
Hirade, M. et al. "Small molecular organic photovoltaic cells with exciton blocking layer at anode interface for improved device performance", Appl. Phys. Lett. 99, 153302 (2011).
Docampo, P. et al. "Efficient organometal trihalide perovskite planar-heterojunction solar cells on flexible polymer substrates", Nat Comms, 4, 2013.
Etgar, L. et al. "Mesoscopic CH3NH3PbI3/TiO2 Heterojunction Solar Cells", J. Am. Chem. Soc., 2012, 134 (42), pp. 17396-17399.
Schneider, B.W. et al. "Pyramidal surface 15 textures for light trapping and antireflection in perovskite-on-silicon tandem solar cells", Optics Express, 22(S6), p. A1422, 2014.
Loper, P. et al. "Oganic-inorganic halide perovskite / crystalline silicon four-terminal tandem solar cells", Physical chemistry chemical physics: PCCP, 17, p. 1619-1629, 2015.
Bailie, C. et al. "Semi-transparent perovskite solar cells for tandems with silicon and CIGS", Energy Environ. Sci., pp. 1-28, 2015.
Filipic, M. et al. "CH3NH3PbI3 perovskite / silicon tandem solar cells: characterization based optical simulations", Optics Express, 23(7), pp. 480-484, 2015.
Mailoa, J.P. et al. "A 2-terminal perovskite/silicon multi-junction solar cell enabled by a silicon tunnel junction", Applied Physics Letters, 106(12), p. 121105, 2015.
Wang, Q. et al. "Control of organic-inorganic halide perovskites in solid-state solar cells: a perspective", Science Bulletin, vol. 60, Issue 4, pp. 405-418, 2015.
Moore, D. et al. "Impact of the organic halide salt on final perovskite composition for photovoltaic applications", APL Materials vol. 2, section 081802, 2014.
Kitazawa, N. et al. "Excitons in self-organized layered perovskite films prepared by the two-step growth process", Thin Solid Films, vol. 500(1), pp. 33-137, 2006.
Hu, H. et al. "Vapour-based processing of hole-conductor-free CH3NH3PbI3 perovskite/C60 fullerene planar solar cells", RSC Advances, 2014, (4) pp. 28964-28967.
Chen, Q. et al. "Planar heterojunction perovskite solar cells via vapor-assisted solution process", J. Am. Chem. Soc. 2014 (136) pp. 622-625.
Burschka, J. et al. "Sequential deposition as a route to high-performance perovskite-sensitized solar cells", Nature, vol. 499, No. 7458, Jul. 18, 2013, pp. 316-319.
Kulbak, M. et al. "How important is the organic part of lead halide perovskite photovoltaic cells? Efficent CsPbBr3 cells", J. Phys. Chem. Lett. 2015 (6) pp. 2452-2456.
Butler, K.T. et al. "Ferroelectric materials for solar energy conversion: photoferroics revisited", Energy Environ. Sci. 2015 (8) pp. 838-848.
Ogomi, Y. et al. "All-solid Sn/Pb halide perovskite sensitized solar cells", 2014 IEEE 40th Photovoltaic Specialist Conference (PVSC) pp. 151-155.
Eperon, G. et al. "Morphological control for high performance, solution-processed planar heterojunction perovskite solar cells", dv. Funct. Mater. (24) pp. 151-157, 2014.
Chen, C. et al. "Efficient and uniform planar-type perovskite solar cells by simple sequential vacuum deposition", Adv. Mater. (26) pp. 6647-6652, 2014.
International Search Report and Written Opinion dated Sep. 12, 2016, from International Application No. PCT/GB2016/051743, 16 pages.
Combined Search and Examination Report under Sections 17 and 18(3) dated Dec. 21, 2015 from United Kingdom Application No. GB1510351.8, 3 pages.
Hupkes, J. et al., "Light Scattering and Trapping in Different Thin Film Photovoltaic Devices," 24th European Photovoltaic Solar Energy Conference, Sep. 21-25, 2009, Hamburg, Germany, pp. 2766-2769.
Third Party Observation received in connection with corresponding EP Patent Application No. 16729359.6 on Sep. 17, 2019.

(56) References Cited

OTHER PUBLICATIONS

Choi, Hyosung et al., "Cesium-doped methylammonium lead iodide perovskite light absorber for hybrid solar cells", Nano Energy, 2014, 7, 80-85.
Liang, Kangning et al., "Synthesis and Characterization of Organic-Inorganic Perovskite Thin Films Prepared Using a Versatile Two-Step Dipping Technique", Chem. Mater., 1998, 10, 403-411.
Office Action relating to Chinese Application No. 201680034238.3, dated Mar. 30, 2020.
Communication Pursuant to Article94(3) EPC, issued for European Application No. 16729359.6, dated Apr. 19, 2021.
Office Action in connection to JP Application No. 2017-564574, dated Jun. 15, 2021.

* cited by examiner

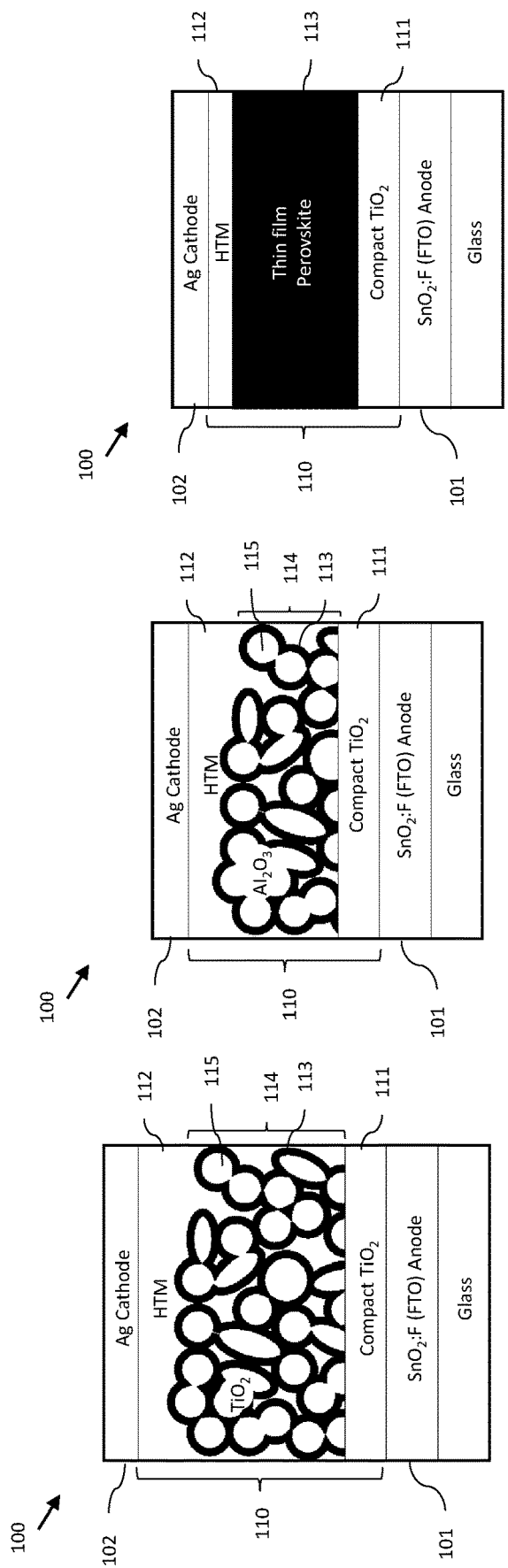

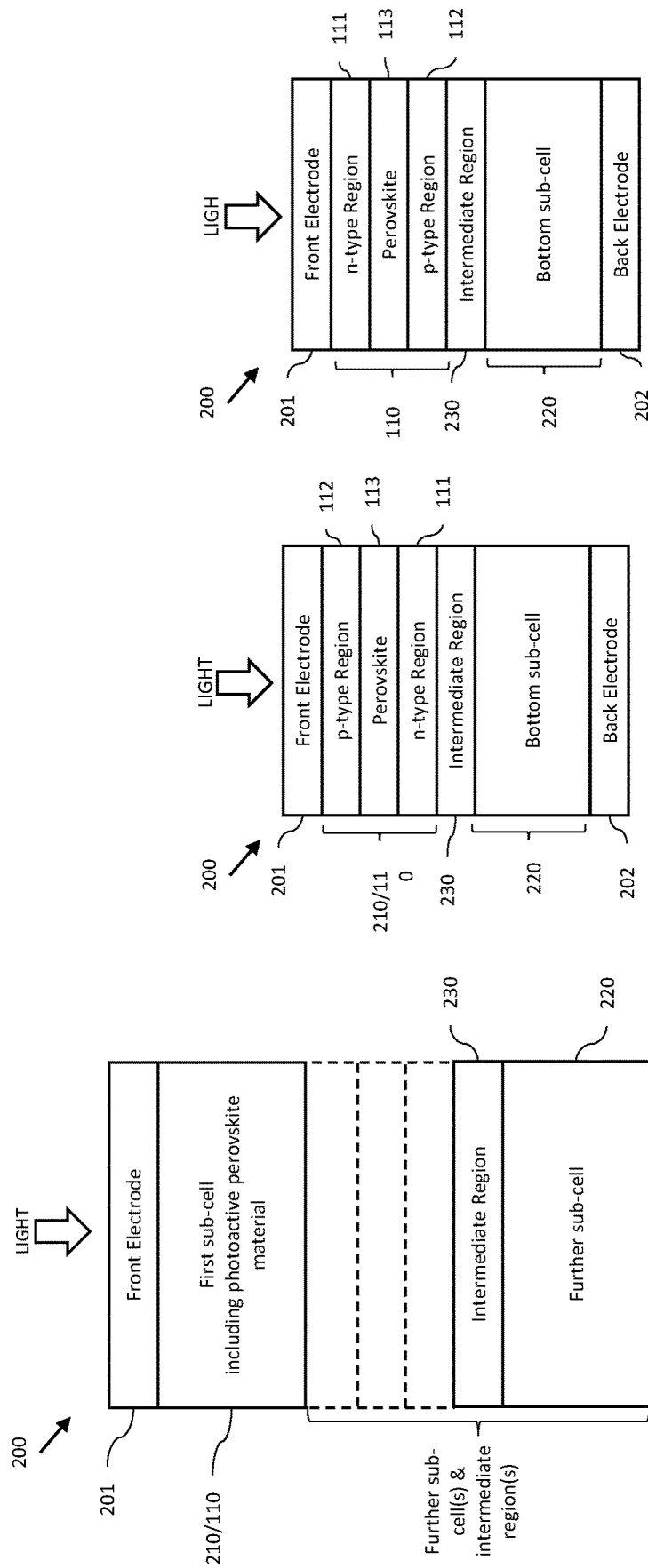

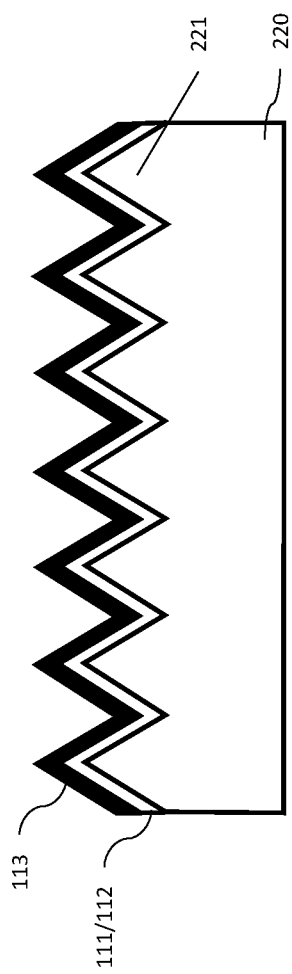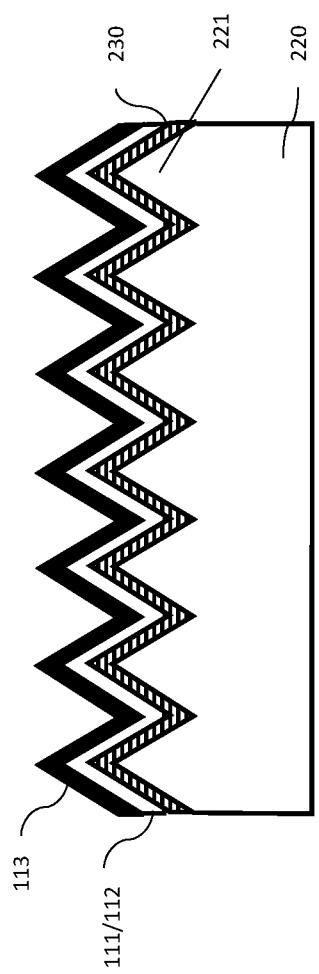

METHOD OF DEPOSITING A PEROVSKITE MATERIAL

FIELD OF THE INVENTION

The present invention relates to a method of depositing a conformal layer of photoactive perovskite material onto a rough or textured surface, and photovoltaic devices that comprise a conformal layer of photoactive perovskite material disposed over a rough or textured surface.

BACKGROUND OF THE INVENTION

Over the past forty years or so there has been an increasing realisation of the need to replace fossil fuels with more secure sustainable energy sources. The new energy supply must also have low environmental impact, be highly efficient and be easy to use and cost effective to produce. To this end, solar energy is seen as one of the most promising technologies, nevertheless, the high cost of manufacturing devices that capture solar energy, including high material costs, has historically hindered its widespread use.

Every solid has its own characteristic energy-band structure which determines a wide range of electrical characteristics. Electrons are able to transition from one energy band to another, but each transition requires a specific minimum energy and the amount of energy required will be different for different materials. The electrons acquire the energy needed for the transition by absorbing either a phonon (heat) or a photon (light). The term "band gap" refers to the energy difference range in a solid where no electron states can exist, and generally means the energy difference (in electron volts) between the top of the valence band and the bottom of the conduction band. The efficiency of a material used in a photovoltaic device, such as a solar cell, under normal sunlight conditions is a function of the band gap for that material. If the band gap is too high, most daylight photons cannot be absorbed; if it is too low, then most photons have much more energy than necessary to excite electrons across the band gap, and the rest will be wasted. The Shockley-Queisser limit refers to the theoretical maximum amount of electrical energy that can be extracted per photon of incoming light and is about 1.34 eV. The focus of much of the recent work on photovoltaic devices has been the quest for materials which have a band gap as close as possible to this maximum.

One class of photovoltaic materials that has attracted significant interest has been the hybrid organic-inorganic halide perovskites. Materials of this type form an $ABX_3$ crystal structure which has been found to show a favourable band gap, a high absorption coefficient and long diffusion lengths, making such compounds ideal as an absorber in photovoltaic devices. Early examples of hybrid organic-inorganic metal halide perovskite materials are reported by Kojima, A. et al., 2009. Organometal halide perovskites as visible-light sensitizers for photovoltaic cells. Journal of the American Chemical Society, 131(17), pp. 6050-1 in which such perovskites were used as the sensitizer in liquid electrolyte based photoelectrochemical cells. Kojima et al report that a highest obtained solar energy conversion efficiency (or power energy conversion efficiency, PCE) of 3.8%, although in this system the perovskite absorbers decayed rapidly and the cells dropped in performance after only 10 minutes.

Subsequently, Lee, M. M. et al., 2012. Efficient hybrid solar cells based on meso-superstructured organometal halide perovskites. Science (New York, N.Y.), 338(6107), pp. 643-7 reported a "meso-superstructured solar cell" in which the liquid electrolyte was replaced with a solid-state hole conductor (or hole-transporting material, HTM), spiro-MeOTAD. Lee et al reported a significant increase in the conversion efficiency achieved, whilst also achieving greatly improved cell stability as a result of avoiding the use of a liquid solvent. In the examples described, $CH_3NH_3PbI_3$ perovskite nanoparticles assume the role of the sensitizer within the photovoltaic cell, injecting electrons into a mesoscopic $TiO_2$ scaffold and holes into the solid-state HTM. Both the $TiO_2$ and the HTM act as selective contacts through which the charge carriers produced by photoexcitation of the perovskite nanoparticles are extracted.

Further work described in WO2013/171517 disclosed how the use of mixed-anion perovskites as a sensitizer/absorber in photovoltaic devices, instead of single-anion perovskites, results in more stable and highly efficient photovoltaic devices. In particular, this document discloses that the superior stability of the mixed-anion perovskites is highlighted by the finding that the devices exhibit negligible colour bleaching during the device fabrication process, whilst also exhibiting full sun power conversion efficiency of over 10%. In comparison, equivalent single-anion perovskites are relatively unstable, with bleaching occurring quickly when fabricating films from the single halide perovskites in ambient conditions.

More recently, WO2014/045021 described planar heterojunction (PHJ) photovoltaic devices comprising a thin film of a photoactive perovskite absorber disposed between n-type (electron transporting) and p-type (hole transporting) layers. Unexpectedly it was found that good device efficiencies could be obtained by using a compact (i.e. without effective/open porosity) thin film of the photoactive perovskite, as opposed to the requirement of a mesoporous composite, demonstrating that perovskite absorbers can function at high efficiencies in simplified device architectures.

Recently some of research into the application of perovskites in photovoltaic devices has focused on the potential of these materials to boost the performance of conventional silicon-based solar cells by combining them with a perovskite-based cell in a tandem/multi-junction arrangement. In this regard, a multi-junction photovoltaic device comprises multiple separate sub-cells (i.e. each with their own photoactive region) that are "stacked" on top of each other and that together convert more of the solar spectrum into electricity thereby increasing the overall efficiency of the device. To do so, each photoactive region of each sub-cell is selected so that the band gap of the photoactive region ensures that it will efficiently absorbs photons from a specific segment of the solar spectrum. This has two important advantages over conventional single-junction photovoltaic devices. Firstly the combination of multiple sub-cells/photoactive regions with different band gaps ensures that a wider range of incident photons can be absorbed by a multi-junction device, and secondly each sub-cell/photoactive region will be more effective at extracting energy from the photons within the relevant part of the spectrum. In particular, the lowest band gap of a multi-junction photovoltaic device will be lower than that of a typical single junction device, such that a multi-junction device will be able to absorb photons that possess less energy than those that can be absorbed by a single junction device. Furthermore, for those photons that would be absorbed by both a multi-junction device and a single junction device, the multi-junction device will absorb those photons more efficiently, as having band gaps closer to the photon energy reduces thermalization losses.

In a multi-junction device, the top sub-cell/photoactive region in the stack has the highest band gap, with the band gap of the lower sub-cells/photoactive regions reducing towards the bottom of the device. This arrangement maximizes photon energy extraction as the top sub-cell/photoactive region absorbs the highest energy photons whilst allowing the transmission of photons with less energy. Each subsequent sub-cell/photoactive region then extracts energy from photons closest to its band gap thereby minimizing thermalization losses. The bottom sub-cell/photoactive region then absorbs all remaining photons with energy above its band gap. When designing multi-junction cells it is therefore important to choose sub-cells whose photoactive regions with the right bandgaps in order to optimise harvesting of the solar spectrum. In this regard, for a tandem photovoltaic device that comprises two sub-cells/photoactive regions, a top sub-cell/photoactive region and a bottom sub-cell/photoactive region, it has been shown that the bottom sub-cell/photoactive region should ideally have a band gap of around 1.1 eV whilst the top sub-cell/photoactive region should ideally have a band gap of around 1.7 eV (Coutts, T. J., Emery, K. a. & Scott Ward, J., 2002. Modeled performance of polycrystalline thin-film tandem solar cells. Progress in Photovoltaics: Research and Applications, 10(3), pp. 195-203).

Consequently, there has been interest in developing hybrid organic-inorganic perovskite solar cells for use in tandem photovoltaic devices given that the band gap of these perovskite materials can be tuned from around 1.5 eV to over 2 eV by varying the halide composition of organometal halide perovskites (Noh, J. H. et al., 2013. Chemical Management for Colourful, Efficient, and Stable Inorganic-Organic Hybrid Nanostructured Solar Cells. Nano letters, 2, pp. 28-31). In particular, by varying the halide composition it is possible to tune the band gap of an organometal halide perovskite to around 1.7 eV, such that it is then ideal for use as the top sub-cell in a tandem structure when combined with a crystalline silicon bottom sub-cell which has a band gap of around 1.12 eV.

In this regard, Schneider, B. W. et al (Schneider, B. W. et al., 2014. Pyramidal surface textures for light trapping and antireflection in perovskite-on-silicon tandem solar cells. Optics Express, 22(S6), p.A1422) reported on the modelling of a perovskite-on-silicon tandem cell in which the modelled cell has a 4-terminal, mechanically stacked structure. Loper, P. et al (Loper, P. et al., 2015. Organic-inorganic halide perovskite/crystalline silicon four-terminal tandem solar cells. Physical chemistry chemical physics: PCCP, 17, p. 1619) reported on the implementation of a four-terminal tandem solar cell consisting of a methyl ammonium lead triiodide ($CH_3NH_3PbI_3$) (i.e. organometal halide perovskite) top sub-cell mechanically stacked on a crystalline silicon heterojunction bottom sub-cell. Similarly, Bailie, C. et al. (Bailie, C. et al., 2015. Semi-transparent perovskite solar cells for tandems with silicon and CIGS. Energy Environ. Sci., pp. 1-28) reported on a mechanically-stacked tandem solar cell consisting of a methyl ammonium lead triiodide ($CH_3NH_3PbI_3$) top sub-cell on a copper indium gallium diselenide (CIGS) or low-quality multi-crystalline silicon bottom sub-cell. Filipic, M. et al. (Filipic, M. et al., 2015. $CH_3NH_3PbI_3$ perovskite/silicon tandem solar cells: characterization based optical simulations. Optics Express, 23(7), pp. 480-484) reported on the simulation of both mechanically stacked (four terminal) and monolithically integrated (two terminal) tandem devices consisting of a methyl ammonium lead triiodide ($CH_3NH_3PbI_3$) top sub-cell and a crystalline silicon bottom sub-cell. Mailoa, J. P. et al. (Mailoa, J. P. et al., 2015. A 2-terminal perovskite/silicon multi-junction solar cell enabled by a silicon tunnel junction. Applied Physics Letters, 106(12), p. 121105) then reported on the fabrication of a monolithic tandem solar cell consisting of a methyl ammonium lead triiodide ($CH_3NH_3PbI_3$) top sub-cell and a crystalline silicon bottom sub-cell.

In a mechanically stacked multi-junction photovoltaic device the individual sub-cells are stacked on top of each other and are each provided with their own separate electrical contacts, such that the individual sub-cells are connected in parallel and do not require current matching. This contrasts with a monolithically integrated multi-junction photovoltaic device in which the individual sub-cells are electrically connected in series between a single pair of terminals, which results in the need for a recombination layer or a tunnel junction and current matching between adjacent sub-cells. Whilst a mechanically stacked multi-junction photovoltaic device does not require current matching between the sub-cells, the additional size and cost of the additional contacts and substrates, and a lower practical efficiency limit, make mechanically stacked structures less favourable than monolithically integrated structures.

When developing a monolithically integrated perovskite-on-silicon multi-junction photovoltaic device one of the most important considerations is the interface between the perovskite sub-cell and the adjacent crystalline silicon bottom sub-cell. In this regard, as described in Schneider, B. W. et al and Filipic, M. et al. referred to above, conventional commercial crystalline silicon solar cells feature textured surfaces that are designed to reduce reflection and increase the optical path length, with these surface textures usually consisting of randomly distributed pyramids, prepared by etching along the faces of the crystal planes, or regular inverted pyramids. These textured surfaces therefore present significant problems for the processing of monolithically integrated perovskite-on-silicon photovoltaic devices, as the overall thickness of the perovskite sub-cell is typically similar to the roughness of the textured surface. For example, the surface roughness of a conventional crystalline silicon solar cell is typically in the range of 500 nm to 10 µm, whilst the thickness of a perovskite cell is typically less than 1 µm. In particular, whilst Schneider, B. W. et al and Filipic, M. et al. attempt to model perovskite-on-silicon tandem cells in which a conformal thin film perovskite sub-cell is deposited onto the textured front surface of a silicon bottom sub-cell, neither document propose a method for achieving this conformal deposition. Furthermore, Bailie, C. et al states that the development of monolithic tandem cell incorporating a perovskite top cell will likely need to planarize the surface silicon bottom cell (i.e. to reduce the roughness of the surface/remove any surface texture).

Consequently, to date the only working example of a monolithically integrated perovskite-on-silicon multi-junction photovoltaic device make use of a silicon bottom sub-cell with a planar top surface in order to simplify the deposition of the perovskite, despite the recognition that this lowers the efficiency of the silicon bottom sub-cell (see Mailoa, J. P. et al. referenced above). Whilst this approach circumvents the problems associated with the deposition of the perovskite cell, this would require the mechanical polishing of conventional crystalline silicon solar cells in order to create a planar surface, thereby increasing the processing costs and reducing the efficiency of the silicon cells.

SUMMARY OF THE PRESENT INVENTION

The inventors have developed a method of depositing a conformal layer of photoactive perovskite material onto a rough or textured surface. In particular, that inventors have developed a method that enables the deposition of a conformal and substantially continuous thin film of photoactive perovskite material over/above the textured top surface of a crystalline silicon solar cell to thereby provide an economical means for boosting/enhancing the performance of market leading crystalline silicon solar cells.

According to a first aspect there is provided a method of producing a photovoltaic device comprising a photoactive region comprising a layer of perovskite material, wherein the layer of perovskite material is disposed on a surface that has a roughness average ($R_a$) or root mean square roughness ($R_{rms}$) of greater than or equal to 50 nm. The method comprises using vapour deposition to deposit a substantially continuous and conformal solid layer comprising one or more initial precursor compounds of the perovskite material on the rough surface. The method further comprises subsequently treating the solid layer comprising the one or more initial precursor compounds with one or more further precursor compounds and thereby reacting the one or more initial precursor compounds and the one or more further precursors compound to form a substantially continuous and conformal solid layer of the perovskite material on the rough surface.

The step of treating the solid layer comprising the one or more initial precursor compounds may comprise using solution deposition to treat the solid layer comprising the one or more initial precursor compounds with a solution comprising the one or more further precursor compounds. Alternatively, the step of treating the solid layer comprising the one or more initial precursor compounds may comprise using vapour deposition to treat the solid layer comprising the one or more initial precursor compounds with the one or more further precursor compounds.

The layer of perovskite material may comprise a thin film of the perovskite material. Preferably the thickness of the thin film of the perovskite material is from 50 nm to 2 μm, and is more preferably from 100 nm to 1000 nm, and is yet more preferably from 200 nm to 700 nm.

The surface may have a roughness average ($R_a$) or root mean square roughness ($R_{rms}$) from 50 nm to 30 μm, preferably from 500 nm to 20 μm, and is more preferably in the range of 1 μm to 10 μm.

The perovskite material preferably comprises a perovskite of the general formula:

$$[A][B][X]_3 \quad (I)$$

wherein [A] is one or more monovalent cations, [B] is one or more divalent inorganic cations, and [X] is one or more halide anions.

[X] may comprise one or more halide anions selected from fluoride, chloride, bromide, and iodide, and preferably selected from chloride, bromide and iodide, and more preferably selected from bromide and iodide. [X] may comprise two different halide anions selected from fluoride, chloride, bromide, and iodide, and preferably selected from chloride, bromide and iodide, and more preferably comprises bromide and iodide.

[A] may comprise one or more organic cations selected from methylammonium ($CH_3NH_3^+$), formamidinium (HC$(NH_2)_2^+$), and ethyl ammonium ($CH_3CH_2NH_3^+$). [A] may comprise one or more inorganic cations selected from $Cs^+$, $Rb^+$, $Cu^+$, $Pd^+$, $Pt^+$, $Ag^+$, $Au^+$, $Rh^+$, and $Ru^+$, and preferably selected from $Cs^+$ and $Rb^+$, and more preferably $Cs^+$.

[B] may comprise at least one divalent inorganic cation selected from $Pb^{2+}$ and $Sn^{2+}$, and preferably comprises $Pb^{2+}$.

Each of the one or more initial precursor compounds comprises one of the one or more divalent inorganic cations [B] and each of the one or more further precursor compounds comprises one of the one or more monovalent cations [A].

Each of the one or more initial precursor compounds and each of the one or more further precursor compounds further comprise one of the one or more halide anions [X].

Where [A] comprises one or more inorganic cations, each of the one or more initial precursor compounds may then comprise one of the one or more monovalent inorganic cations [A] and each of the one or more further precursor compounds may then comprise one of the one or more divalent inorganic cations [B].

Each of the one or more initial precursor compounds and each of the one or more further precursor compounds may further comprise one of the one or more halide anions [X].

The step of using vapour deposition to deposit a substantially continuous and conformal solid layer comprising the one or more initial precursor compounds of the perovskite material on the rough surface may comprise using vapour deposition to deposit on to the rough surface a substantially continuous and conformal solid layer comprising inorganic material, and subsequently treating the solid layer of inorganic material with a gas of halide X and thereby reacting the inorganic material and the halide to form a substantially continuous and conformal solid layer comprising the one or more initial precursor compounds on the rough surface.

Each of the one or more initial precursor compounds may then comprise one of the one or more divalent inorganic cations [B] and the inorganic material comprises inorganic material from which the one or more divalent inorganic cations [B] are formed. The one or more monovalent cations [A] may comprise one or more inorganic cations, and each of the one or more initial precursor compounds may comprise one of the one or more monovalent inorganic cations and the inorganic material comprises inorganic material from which the one or more monovalent inorganic cations are formed.

The band gap of the perovskite material may be from 1.10 eV to 2.30 eV, and is preferably from 1.65 eV to 1.75 eV.

The photovoltaic device may have a multi-junction structure comprising a first sub-cell disposed over a second sub-cell, the first sub-cell comprising the photoactive region comprising the perovskite material.

An adjacent surface of the second sub-cell may then have a roughness average ($R_a$) or root mean square roughness ($R_{rms}$) of greater than or equal to 50 nm, and the rough surface on which the layer of perovskite material is disposed may then be a surface that conforms to the rough surface of the second sub-cell.

The rough surface of the second sub-cell may comprise a surface of or within the second sub-cell that is provided with a surface texture, and the surface texture then preferably comprises one of pyramids and inverted pyramids.

The surface on which the solid layer of perovskite material is disposed may be any one of an adjacent surface of the second sub-cell, and an adjacent surface of a layer that is disposed between the solid layer of perovskite material and the second sub-cell and that conforms to the rough surface of the second sub-cell. The solid layer of perovskite material may be separated from the second sub-cell by one or more layers that each substantially conform to the rough surface of the second sub-cell.

According to a second aspect there is provided a multi-junction photovoltaic device comprising a first sub-cell disposed over a second sub-cell, the first sub-cell comprising the photoactive region comprising a solid layer of perovskite material, wherein a surface of the second sub-cell that is adjacent to the first sub-cell has a roughness average ($R_a$) or root mean square roughness ($R_{rms}$) of greater than or equal to 50 nm, and the solid layer of perovskite material is disposed as a substantially continuous and conformal layer on a surface that conforms to the rough surface of the second sub-cell.

The rough surface of the second sub-cell that is adjacent to the first sub-cell may comprise a surface within the second sub-cell that is provided with a surface texture, and the surface texture then preferably comprises one of pyramids and inverted pyramids.

The surface on which the solid layer of perovskite material is disposed may be any of an adjacent surface of the second sub-cell, and an adjacent surface of a layer that is disposed between the solid layer of perovskite material and the second sub-cell and that conforms to the rough surface of the second sub-cell.

The solid layer of perovskite material may be separated from the second sub-cell by one or more layers that each substantially conform to the rough surface of the second sub-cell. The one or more layers that separate the solid layer of perovskite material from the second sub-cell and that each substantially conform to the rough surface of the second sub-cell may then comprise any of a charge transporting layer of the photoactive region of the first sub-cell, and one or more interconnect layers disposed between and connecting the first sub-cell and the second sub-cell.

The surface on which the solid layer of perovskite material is disposed may comprises any of an adjacent surface of a charge transporting layer of the photoactive region of the first sub-cell, and an adjacent surface of an interconnect layer disposed between and connecting the first sub-cell and the second sub-cell.

The solid layer of perovskite material may comprise a thin film of the perovskite material. Preferably the thickness of the thin film of the perovskite material is then from 50 nm to 2 µm, and is more preferably from 100 nm to 1000 nm, and is yet more preferably from 200 nm to 700 nm.

The rough surface of the second sub-cell may have a roughness average ($R_a$) or root mean square roughness ($R_{rms}$) from 50 nm to 30 µm, preferably from 500 nm to 20 µm, and more preferably from 1 µm to 10 µm.

The second sub-cell may comprise any of a second perovskite material, crystalline silicon, CdTe, CuZnSnSSe, CuZnSnS, or CuInGaSe (CIGS). The second sub-cell may comprise a crystalline silicon sub-cell, and preferably the crystalline silicon sub-cell comprises a silicon heterojunction (SHJ), and more preferably the crystalline silicon sub-cell comprises an amorphous silicon:crystalline silicon heterojunction.

The perovskite material may comprise a perovskite of the formula:

$$[A][B][X]_3 \quad (I)$$

wherein [A] is one or more monovalent cations, [B] is one or more divalent inorganic cations, and [X] is one or more halide anions.

[X] may comprise one or more halide anions selected from fluoride, chloride, bromide, and iodide, and preferably selected from chloride, bromide and iodide, and more preferably selected from bromide and iodide. [X] may comprise two different halide anions selected from fluoride, chloride, bromide, and iodide, and preferably selected from chloride, bromide and iodide, and more preferably comprises bromide and iodide.

[A] may comprise one or more organic cations selected from methylammonium ($CH_3NH_3^+$), and formamidinium ($HC(NH_2)_2^+$). [A] may comprise one or more inorganic cations selected from $Cs^+$, $Rb^+$, $Cu^+$, $Pd^+$, $Pt^+$, $Ag^+$, $Au^+$, $Rh^+$, and $Ru^+$, and preferably selected from $Cs^+$ and $Rb^+$, and more preferably $Cs^+$.

[B] may comprise at least one divalent inorganic cation selected from $Pb^{2+}$ and $Sn^{2+}$, and preferably comprises $Pb^{2+}$.

The band gap of the perovskite material may be from 1.10 eV to 2.30 eV, and is preferably from 1.65 eV to 1.75 eV.

The perovskite material is preferably configured to function as a light absorber/photosensitizer within the photoactive region.

The photoactive region may comprises an n-type region comprising at least one n-type layer, a p-type region comprising at least one p-type layer; and a layer of the perovskite material disposed between the n-type region and the p-type region. The layer of charge transporting material may then comprise any of an n-type layer of the n-type region and a p-type layer of the p-type region.

The photoactive region may comprise a layer of the perovskite material without open porosity. The layer of perovskite material may then form a planar heterojunction with one or both of the n-type region and the p-type region.

The photovoltaic device may further comprises, a first electrode, a second electrode, with the first sub-cell and the second sub-cell disposed between the first and second electrodes. The first electrode may be in contact with the p-type region of the first sub-cell and the second electrode may then be in contact with the second sub-cell. The first electrode then preferably comprises a transparent or semi-transparent electrically conductive material and the second electrode preferably comprises a metal. Alternatively, the first electrode may be in contact with the n-type region of the first sub-cell and the second electrode may be in contact with the second sub-cell. The first electrode then preferably comprises a transparent or semi-transparent electrically conductive material and the second electrode comprises a metal.

BRIEF DESCRIPTION OF THE DRAWINGS

The present invention will now be more particularly described by way of example only with reference to the accompanying drawings, in which:

FIG. 3a illustrates schematically an exemplary perovskite-based single junction photovoltaic device having an extremely thin absorber (ETA) cell architecture;

FIG. 3b illustrates schematically an exemplary perovskite-based single junction photovoltaic device having a meso-superstructured solar cell (MSSC) architecture;

FIG. 3c illustrates schematically an exemplary perovskite-based single junction photovoltaic device having a flat/planar junction architecture;

FIG. 4 illustrates schematically a multi-junction photovoltaic device;

FIG. 5a illustrates schematically a perovskite-based multi-junction photovoltaic device having a regular structure;

FIG. 5b illustrates schematically a perovskite-based multi-junction photovoltaic device having an inverted structure;

FIG. 7a illustrates schematically a conformal layer of perovskite material deposited over the rough top surface of a lower sub-cell of a multi-junction photovoltaic device;

FIG. 7b illustrates schematically a conformal layer of perovskite material deposited over the rough top surface of a lower sub-cell of a multi-junction photovoltaic device;

DETAILED DESCRIPTION

Definitions

Figure 2A:
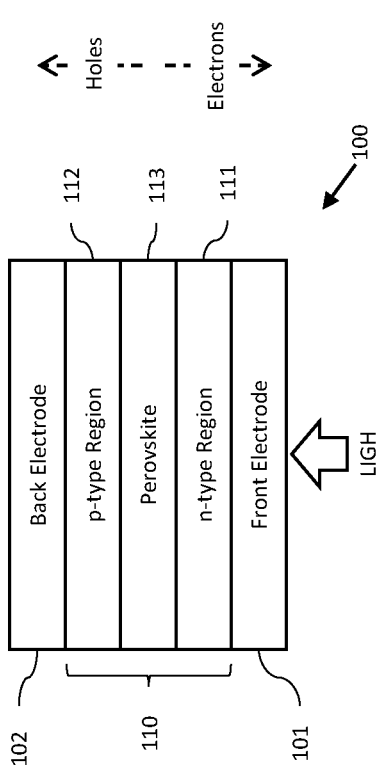
FIG. 2a illustrates schematically a perovskite-based single junction photovoltaic device having a regular structure.

The term "photoactive", as used herein, refers to a region, layer or material that is capable of responding to light photoelectrically. A photoactive region, layer or material is therefore capable of absorbing the energy carried by photons in light that then results in the generation of electricity (e.g. by generating either electron-hole pairs or excitons).

The term "conform", as used herein, refers to an object that is substantially the same in form or shape as another object. A "conformal layer", as used herein, therefore refers to a layer of material that conforms to the contours of the surface on which the layer is formed. In other words, the morphology of the layer is such that the thickness of the layer is approximately constant across the majority of the interface between the layer and the surface on which the layer is formed.

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$ type structure comprises a layer of perovskite material. The skilled person will appreciate that a perovskite material can be represented by the formula [A][B][X]$_3$, wherein [A] is at least one cation, [B] is at least one cation and [X] is at least one anion. When the perovskite comprises more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will often be lower than that of $CaTiO_3$.

As mentioned in the preceding paragraph, the term "perovskite", as used herein, refers to (a) a material with a three-dimensional crystal structure related to that of $CaTiO_3$ or (b) a material comprising a layer of material, wherein the layer has a structure related to that of $CaTiO_3$. Although both of these categories of perovskite may be used in the devices according to the invention, it is preferable in some circumstances to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is [2-(1-cyclohexenyl)ethylammonium]$_2$PbBr$_4$. 2D layered perovskites tend to have high exciton binding energies, which favours the generation of bound electron-hole pairs (excitons), rather than free charge carriers, under photoexcitation. The bound electronhole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite of the first category, (a), i.e. a perovskite which has a three-dimensional crystal structure. This is particularly preferable when the optoelectronic device is a photovoltaic device.

The perovskite material employed in the present invention is one which is capable of absorbing light and thereby generating free charge carriers. Thus, the perovskite employed is a light-absorbing perovskite material. However, the skilled person will appreciate that the perovskite material could also be a perovskite material that is capable of emitting light, by accepting charge, both electrons and holes, which subsequently recombine and emit light. Thus, the perovskite employed may be a light-emitting perovskite.

As the skilled person will appreciate, the perovskite material employed in the present invention may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material.

Typically, the perovskite semiconductor used in the present invention is a photosensitizing material, i.e. a material which is capable of performing both photogeneration and charge transportation.

The term "mixed-anion", as used herein, refers to a compound comprising at least two different anions. The term "halide" refers to an anion of an element selected from Group 17 of the Periodic Table of the Elements, i.e., of a halogen. Typically, halide anion refers to a fluoride anion, a chloride anion, a bromide anion, an iodide anion or an astatide anion.

The term "metal halide perovskite", as used herein, refers to a perovskite, the formula of which contains at least one metal cation and at least one halide anion. The term "organometal halide perovskite", as used herein, refers to a metal halide perovskite, the formula of which contains at least one organic cation.

The term "organic material" takes its normal meaning in the art. Typically, an organic material refers to a material comprising one or more compounds that comprise a carbon atom. As the skilled person would understand it, an organic compound may comprise a carbon atom covalently bonded to another carbon atom, or to a hydrogen atom, or to a halogen atom, or to a chalcogen atom (for instance an oxygen atom, a sulphur atom, a selenium atom, or a tellurium atom). The skilled person will understand that the term "organic compound" does not typically include compounds that are predominantly ionic such as carbides, for instance.

The term "organic cation" refers to a cation comprising carbon. The cation may comprise further elements, for example, the cation may comprise hydrogen, nitrogen or oxygen.

The term "semiconductor", as used herein, refers to a material with electrical conductivity intermediate in magnitude between that of a conductor and a dielectric. A semiconductor may be an n-type semiconductor, a p-type semiconductor or an intrinsic semiconductor.

The term "dielectric", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV (The band gap of titania is about 3.2 eV.)

The term "n-type", as used herein, refers to a region, layer or material that comprises an extrinsic semiconductor with a larger concentration of electrons than holes. In n-type semiconductors, electrons are therefore majority carriers and holes are the minority carriers, and they are therefore electron transporting materials. The term "n-type region", as used herein, therefore refers to a region of one or more electron transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

The term "p-type", as used herein, refers to a region, layer or material that comprises an extrinsic semiconductor with a larger concentration of holes than electrons. In p-type semiconductors, holes are the majority carriers and electrons are the minority carriers, and they are therefore hole transporting materials. The term "p-type region", as used herein, therefore refers to a region of one or more hole transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "band gap", as used herein, refers to the energy difference between the top of the valence band and the bottom of the conduction band in a material. The skilled person may readily measure the band gap of a material without undue experimentation.

The term "layer", as used herein, refers to any structure which is substantially laminar in form (for instance extending substantially in two perpendicular directions, but limited in its extension in the third perpendicular direction). A layer may have a thickness which varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

The term "porous", as used herein, refers to a material within which pores are arranged. Thus, for instance, in a porous material the pores are volumes within the body of the material where there is no material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (Rouquerol, J. et al, (1994) Recommendations for the characterization of porous solids (Technical Report). Pure and Applied Chemistry, 66(8)). The following distinctions and definitions were adopted in previous IUPAC documents (J. Haber. (1991) Manual on catalyst characterization (Recommendations 1991). Pure and Applied Chemistry.): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid to which the material is exposed. An "open pore" on the other hand, would be accessible by such a fluid. The concepts of open and closed porosity are discussed in detail in J. Rouquerol et al.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". The term "without open porosity", as used herein, therefore refers to a material with no effective porosity. Thus, a material without open porosity typically has no macropores and no mesopores. A material without open porosity may comprise micropores and nanopores, however. Such micropores and nanopores are typically too small to have a negative effect on a material for which low porosity is desired.

In addition, polycrystalline materials are solids that are composed of a number of separate crystallites or grains, with grain boundaries at the interface between any two crystallites or grains in the material. A polycrystalline material can therefore have both interparticle/interstitial porosity and intraparticle/internal porosity. The terms "interparticle porosity" and "interstitial porosity", as used herein, refer to pores between the crystallites or grains of the polycrystalline material (i.e. the grain boundaries), whilst the terms "intraparticle porosity" and "internal porosity", as used herein, refer to pores within the individual crystallites or grains of the polycrystalline material. In contrast, a single crystal or monocrystalline material is a solid in which the crystal lattice is continuous and unbroken throughout the volume of the material, such that there are no grain boundaries and no interparticle/interstitial porosity.

The term "compact layer", as used herein, refers to a layer without mesoporosity or macroporosity. A compact layer may sometimes have microporosity or nanoporosity.

The term "scaffold material", as used herein, therefore refers to a material that is capable of acting as a support for a further material. The term "porous scaffold material", as used herein, therefore refers to a material which is itself porous, and which is capable of acting as a support for a further material.

The term "transparent", as used herein, refers to material or object allows visible light to pass through almost undisturbed so that objects behind can be distinctly seen. The term "semi-transparent", as used herein, therefore refers to material or object which has a transmission (alternatively and equivalently referred to as a transmittance) to visible light intermediate between a transparent material or object and an opaque material or object. Typically, a transparent material will have an average transmission for visible light (generally light with a wavelength of from 370 to 740 nm) of around 100%, or from 90 to 100%. Typically, an opaque material will have an average transmission for visible light of around 0%, or from 0 to 5%. A semi-transparent material or object will typically have an average transmission for visible light of from 10 to 90%, typically 40 to 60%. Unlike many translucent objects, semi-transparent objects do not typically distort or blur images. Transmission for light may be measured using routine methods, for instance by comparing the intensity of the incident light with the intensity of the transmitted light.

The term "electrode", as used herein, refers to a conductive material or object through which electric current enters or leaves an object, substance, or region. The term "negative electrode", as used herein, refers to an electrode through which electrons leave a material or object (i.e. an electron collecting electrode). A negative electrode is typically referred to as an "anode". The term "positive electrode", as used herein, refers to an electrode through which holes leave a material or object (i.e. a hole collecting electrode). A positive electrode is typically referred to as a "cathode". Within a photovoltaic device, electrons flow from the positive electrode/cathode to the negative electrode/anode, whilst holes flow from the negative electrode/anode to the positive electrode/cathode.

The term "front electrode", as used herein, refers to the electrode provided on that side or surface of a photovoltaic device that it is intended will be exposed to sun light. The front electrode is therefore typically required to be transparent or semi-transparent so as to allow light to pass through the electrode to the photoactive layers provided beneath the front electrode. The term "back electrode", as used herein, therefore refers to the electrode provided on that side or surface of a photovoltaic device that is opposite to the side or surface that it is intended will be exposed to sun light.

The term "charge transporter" refers to a region, layer or material through which a charge carrier (i.e. a particle carrying an electric charge), is free to move. In semiconductors, electrons act as mobile negative charge carriers and holes act as mobile positive charges. The term "electron transporter" therefore refers to a region, layer or material through which electrons can easily flow and that will typically reflect holes (a hole being the absence of an electron that is regarded as a mobile carrier of positive charge in a semiconductor). Conversely, the term "hole transporter" refers to a region, layer or material through which holes can easily flow and that will typically reflect electrons.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

The term "volatile compound", as used herein, refers to a compound which is easily removed by evaporation or decomposition. For instance a compound which is easily removed by evaporation or decomposition at a temperature of less than or equal to 150° C., or for instance at a temperature of less than or equal to 100° C., would be a volatile compound. "Volatile compound" also includes compounds which are easily removed by evaporation via decomposition products. Thus, a volatile compound X may evaporate easily thorough evaporation of molecules of X, or a volatile compound X may evaporate easily by decomposing to form two compounds Y and Z which evaporate easily. For instance, ammonium salts can be volatile compounds, and may either evaporate as molecules of the ammonium salt or as decomposition products, for instance ammonium and a hydrogen compound (e.g. a hydrogen halide). Thus, a volatile compound X may have a relatively high vapour pressure (e.g. greater than or equal to 500 Pa) or may have a relatively high decomposition pressure (e.g. greater than or equal to 500 Pa for one or more of the decomposition products), which may also be referred to as a dissociation pressure.

The term "roughness", as used herein, refers to the texture of a surface or edge that is uneven or irregular (and therefore lacks smoothness or regularity). The roughness of a surface can be quantified by any measure of the deviations of the surface in a direction that is typically normal to the average surface. As a measure of roughness, the roughness average or mean roughness ($R_a$) is the arithmetical mean of the absolute values of all deviations from a straight line within a specified reference or sampling length of the surface profile. As an alternative measure of roughness, the root mean square roughness ($R_{rms}$ or $R_q$) is the root mean square of the values of all deviations from a straight line within a specified reference or sampling length of the surface profile.

Device Structure

Figure 1:
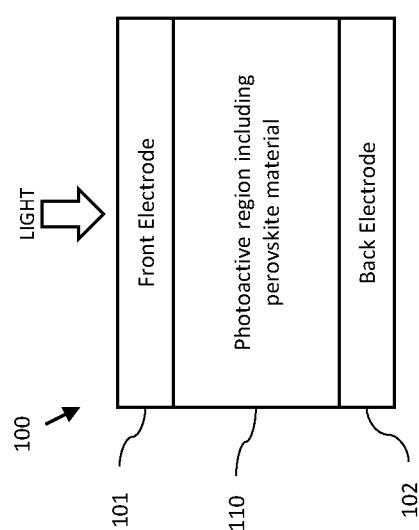
FIG. 1 illustrates schematically a single junction photovoltaic device.

FIG. 1 illustrates schematically a single junction photovoltaic device 100 comprising a transparent or semi-transparent front electrode 101 and a back electrode 102, with a photoactive region 110 disposed between the front and back electrodes, wherein the photoactive region comprises a perovskite material of general formula (I):

[A][B][X]$_3$             (I)

wherein [A] is at least one monovalent cation, [B] is at least one divalent inorganic cation, and [X] is at least one halide anion.

The perovskite material is configured to function as a light absorber/photosensitizer within the photoactive region. In addition, the perovskite material in the photoactive region may also be configured to provide charge transport. In this regard, perovskite materials are able to act not only a light absorber (i.e. photosensitizer) but also as an n-type, p-type or intrinsic (i-type) semiconductor material (charge transporter). A perovskite material can therefore act both as a photosensitizer and as the n-type semiconductor material. The perovskite material may therefore assume the roles both of light absorption and long range charge transport.

Figure 2B:
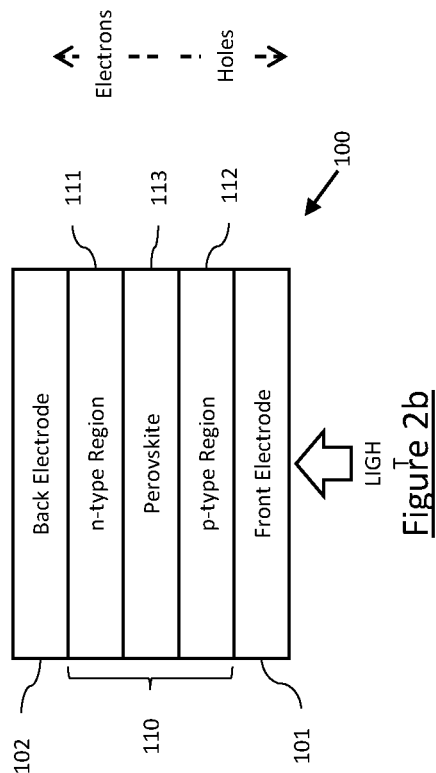
FIG. 2b illustrates schematically a perovskite-based single junction photovoltaic device having an inverted structure.

FIGS. 2a and 2b illustrate schematically separate structures for single junction photovoltaic devices 100 in which a photoactive region 110 comprises a perovskite material of general formula (I). In each of these embodiments, the photoactive region 110 comprises an n-type region 111 comprising at least one n-type layer, a p-type region 112 comprising at least one p-type layer, and a layer of the perovskite material 113 disposed between the n-type region and the p-type region.

The device illustrated in FIG. 2a has what is considered a regular structure for a perovskite-based single junction photovoltaic device wherein the front electrode 101 is in contact with the n-type region 111 of the photoactive region 110 and the back electrode 102 is in contact with the p-type region 112 of the photoactive region 110a (see, for example, Docampo, P et al. (2013) Efficient organometal trihalide perovskite planar-heterojunction solar cells on flexible polymer substrates. Nat Comms, 4). The front electrode 101 therefore functions as a negative (electron collecting) electrode, whilst the back electrode 102 functions as a positive (hole collecting) electrode.

By way of example, in the exemplary device structure illustrated in FIG. 2a the front electrode may comprise a transparent conductive oxide (TCO) such as tin-doped indium-oxide (ITO), fluorine doped tin oxide (FTO) etc., the n-type region may comprise one or more layers of n-type material (e.g. where each layer of n-type material may comprise an n-type material selected from those detailed above), the p-type region may comprise one or more layers of p-type material (e.g. where each layer of p-type material may comprise a p-type material selected from those detailed above), and the back electrode may comprise a high work function metal such as gold (Au) silver (Ag), nickel (Ni), palladium (Pd), platinum (Pt) or aluminium (Al).

In contrast, the device illustrated in FIG. 2b has what is considered to be an inverted structure for a perovskite-based single junction photovoltaic device wherein the front electrode 101 is in contact with the p-type region 112 of the photoactive region 110 and the back electrode 102 is in contact with the n-type region 111 of the photoactive region 110. The front electrode 101 therefore functions as positive (hole collecting) electrode, whilst the back electrode 102 functions as a negative (electron collecting) electrode.

By way of example, in the exemplary device structure illustrated in FIG. 2b the front electrode may comprise a transparent conductive oxide (TCO) such as tin-doped indium-oxide (ITO), fluorine doped tin oxide (FTO) etc., the p-type region may comprise one or more layers of p-type material (e.g. where each layer of p-type material may comprise a p-type material selected from those detailed above), the n-type region may comprise one or more layers of n-type material (e.g. where each layer of n-type material may comprise an n-type material selected from those detailed above), and the back electrode may comprise a high work function metal such as gold (Au) silver (Ag), nickel (Ni), palladium (Pd), platinum (Pt) or aluminium (Al).

Both of the devices illustrated in FIGS. 2a and 2b include an n-type region and a p-type region, with the photoactive perovskite material disposed between the n-type region and the p-type region, such that the n-type (electron-transporting) region and the p-type (hole-transporting) region act to transport charge generated in the perovskite material towards the respective electrodes. However, it is also possible for such devices to include only one charge transporting region. In particular, it has been shown that functional photovoltaic devices comprising a photoactive perovskite can be formed without any hole-transporting materials, such that the photoactive perovskite is in direct contact with an electrode and/or metal layer (see Etgar, L., Gao, P. & Xue, Z., 2012. Mesoscopic CH$_3$NH$_3$PbI$_3$/TiO$_2$ heterojunction solar cells. J. Am. Chem. Soc., 2012, 134 (42), pp 17396-17399). In such devices, the photoactive perovskite assumes the roles of both light harvester and hole transporter, such that an additional hole transporting material is redundant.

FIGS. 3a to 3c illustrate some detailed examples of perovskite-based single junction photovoltaic devices.

In FIGS. 3a and 3b, the photoactive region 110 of the photovoltaic device 100 comprises a porous region 114, wherein the porous region 114 comprises a layer of the perovskite material 113 of formula (I) that is in contact with a porous scaffold material 115 that is disposed between the n-type region 111 and the p-type region 112. In these structures, the layer of the perovskite material 113 is provided as a coating on the porous scaffold material 115, thereby forming a substantially conformal layer on the surface of the porous scaffold, such that the perovskite material 113 is disposed within pores of the porous scaffold. The p-type region 112 comprises a charge transporting material then fills the pores of porous region 114 (i.e. the pores of the perovskite-coated porous scaffold) and forms a capping layer over the porous material. In this regard, the capping layer of charge transporting material consists of a layer of the charge transporting material without open porosity.

In FIG. 3a, the illustrated photovoltaic device 100 has what has been referred to as an extremely thin absorber (ETA) cell architecture in which an extremely thin layer of the light absorbing perovskite material is provided at the interface between nanostructured, interpenetrating n-type (e.g. TiO$_2$) and p-type semiconductors (e.g. HTM). In this arrangement, the porous scaffold material 115 within the photoactive region 110 comprises a semiconducting/charge transporting material.

In FIG. 3b, the illustrated photovoltaic device 100 has what has been referred to as a meso-superstructured solar cell (MSSC) architecture in which an extremely thin layer of the light absorbing perovskite material is provided on a mesoporous insulating scaffold material. In this arrangement, the porous scaffold material 115a within the photoactive region 110 comprise a dielectric material (e.g. $Al_2O_3$).

In FIG. 3c, the photoactive region 110 comprises a layer of the perovskite material 113 of formula (I) without open porosity. As described above, a material without open porosity typically has no macropores and no mesopores, but may have micropores and nanopores (and therefore may have intercrystalline pores). The layer of perovskite material 113 therefore forms a planar heterojunction with one or both of the n-type region 111 and the p-type region 112. Either the n-type region 111 or the p-type region 112 may be disposed on the layer of the perovskite material 113 without open porosity. In this regard, as the layer of the perovskite material 113 is without open porosity, no n-type or p-type material infiltrates the perovskite material to form a bulk heterojunction; rather it forms a planar heterojunction with the perovskite material. Typically, the layer of the perovskite material 113 without open porosity is in contact with both the n-type region and the p-type region, and therefore forms a planar heterojunction with both the n-type region and the p-type region.

In FIG. 3c, the illustrated photovoltaic device 100 therefore has a thin film planar heterojunction device architecture in which a solid thin layer of the light absorbing perovskite material is provided between planar layers of n-type (e.g. $TiO_2$) and p-type semiconductors (e.g. HTM). In this arrangement, the device does not include a porous scaffold material.

In an alternative structure, the photoactive region may comprise a layer of the perovskite material of formula (I) wherein the perovskite material fills the pores of a porous scaffold material and forms a capping layer of the perovskite material over the porous scaffold material, wherein the capping layer of the perovskite material is not infiltrated by the porous scaffold material. The layer of the perovskite material is therefore in contact with the porous scaffold material. Typically, the capping layer consists of a layer of the perovskite material without open porosity that therefore forms a planar heterojunction with one of the n-type region and the p-type region.

In a yet further structure, the photoactive region may comprise a layer of the perovskite material of formula (I) wherein the perovskite material is itself porous. A charge transporting material then fills the pores of porous region of perovskite material and forms a capping layer over the porous perovskite material. In this regard, the capping layer of charge transporting material consists of a layer of the charge transporting material without open porosity.

FIG. 4 then illustrates a multi-junction photovoltaic device 200 that includes a first sub-cell 210, in which the photoactive region 110 comprises a perovskite material of general formula (I), and one or more further sub-cells 220 disposed between the front 201 and back electrodes 202. In particular, FIG. 4 illustrates a monolithically integrated multi-junction photovoltaic device wherein each sub-cell 210, 220 is connected to an adjacent sub-cell by an intermediate region 230 comprising one or more interconnect layers (e.g. a recombination layer or a tunnel junction). In a monolithically integrated multi-junction photovoltaic device the individual sub-cells are electrically connected in series, which results in the need for a recombination layer or a tunnel junction and current matching. In contrast, in a mechanically stacked multi-junction photovoltaic device the individual sub-cells are provided with separate electrical contacts and therefore do not require current matching. However, the additional size and cost of the additional contacts and substrates, and heat dispersing difficulties make mechanically stacked structures less favourable than monolithically integrated structures.

FIGS. 5a and 5b illustrate schematically separate embodiments of multi-junction photovoltaic devices 200 having first sub-cell 210 in which the photoactive region 110 comprises a perovskite material of general formula (I) and one or more further sub-cell 220.

In each of these embodiments, the multi-junction photovoltaic device 200 has a monolithically integrated structure that therefore comprises just two electrodes, the front 201 and back electrodes 202, with the first sub-cell 210 and the one or more further sub-cell 220 disposed between these two electrodes. Furthermore, as the monolithically integrated structure comprises just two electrodes, each sub-cell is connected to an adjacent sub-cell by an intermediate region 230, wherein each intermediate region comprises one or more interconnect layers. For example, the interconnect layer(s) can comprise any of a recombination layer and a tunnel junction.

In each of these embodiments, the photoactive region 110 of the first sub-cell 210 may have the same structure as any of the photoactive regions described above. For example, in the embodiments illustrated in FIGS. 5a and 5b the photoactive region 110 can have the same structure as the photoactive region of the extremely thin absorber (ETA) cell architecture of the single junction device illustrated in FIG. 3a. Alternatively, the photoactive region 110 of the first sub-cell 210 can have the same structure as the photoactive region of the meso-superstructured solar cell (MSSC) architecture of the single junction device illustrated in FIG. 3b. As a further alternative, the photoactive region 110 of the first sub-cell 210 can have the same structure as the photoactive region of the thin film planar heterojunction device architecture of the single junction device illustrated in FIG. 3c.

In each of these embodiments, as in a single junction device, the photoactive region 110 of the first sub-cell 210 comprises an n-type region 111 comprising at least one n-type layer, a p-type region 112 comprising at least one p-type layer, with a layer of the perovskite material 113 disposed between the n-type region 111 and the p-type region 112.

By way of example, each of the one or more further sub-cells 220 of the multi-junction photovoltaic device 200 may comprise any of a second photoactive perovskite material, amorphous silicon, crystalline silicon (i.e. monocrystalline or polycrystalline), CdTe, CuZnSnSSe, CuZnSnS, or CuInGaSe (CIGS).

The device illustrated in FIG. 5a has what is considered a regular structure for a perovskite-based multi-junction photovoltaic device 200, wherein the front electrode 201 is in contact with the p-type region 112 of the photoactive region 110 of the first sub-cell 210 and the back electrode 202 is in contact with one of the one or more further sub-cells 220. The front electrode 201 therefore functions as a positive (hole collecting) electrode, whilst the back electrode 202 functions as a negative (electron collecting) electrode In FIG. 5a the illustrated multi-junction photovoltaic device 200 is a tandem device comprising two sub-cells 210, 220, wherein the top/upper/first sub-cell 210 comprises a photoactive region 110 that comprises a photosensitive/light absorbing perovskite material 113 of formula (I) and the bottom/lower/second sub-cell 220 can, for example, comprise a crystalline silicon-based sub-cell.

By way of example, in this exemplary structure the front electrode 201 may comprise a transparent conductive oxide (TCO) such as tin-doped indium-oxide (ITO), fluorine doped tin oxide (FTO) etc., the p-type region 112 of the first sub-cell 210 may comprise one or more layers of p-type material (e.g. where each layer of p-type material may comprise a p-type material selected from those detailed above), the n-type region 111 of the first sub-cell 210 may comprise one or more layers of n-type material (e.g. where each layer of n-type material may comprise an n-type material selected from those detailed above), and the back electrode 202 may comprise a high work function metal such as gold (Au) silver (Ag), nickel (Ni), palladium (Pd), platinum (Pt) or aluminium (Al). By way of example, the intermediate region 230 could comprise a recombination layer comprising a layer of ITO.

In contrast, the device illustrated in FIG. 5b has what is considered to be an inverted structure for a perovskite-based multi-junction photovoltaic device 200 wherein the front electrode 201 is in contact with the n-type region 111 of the of the first sub-cell 210 and the back electrode 202 is in contact with one of the one or more further sub-cell 220. The front electrode 201 therefore functions as a negative (electron collecting) electrode, whilst the back electrode 202 functions as a positive (hole collecting) electrode.

In FIG. 5b the illustrated multi-junction photovoltaic device 200 is a tandem device comprising two sub-cells 210, 220, wherein the top/upper/first sub-cell 210 comprises a photoactive region 110 that comprises a photosensitive/light absorbing perovskite material 113 of formula (I) and the bottom/lower/second sub-cell 220 can, for example, comprise a crystalline silicon-based sub-cell.

By way of example, in this exemplary structure the front electrode 201 may comprise a transparent conductive oxide (TCO) such as tin-doped indium-oxide (ITO), fluorine doped tin oxide (FTO) etc., the n-type region 111 of the first sub-cell 210 may comprise one or more layers of n-type material (e.g. where each layer of n-type material may comprise an n-type material selected from those detailed above, the p-type region 112 of the first sub-cell 210 may comprise one or more layers of p-type material (e.g. where each layer of p-type material may comprise a p-type material selected from those detailed above), and the back electrode 202 may comprise a high work function metal such as gold (Au) silver (Ag), nickel (Ni), palladium (Pd), platinum (Pt) or aluminium (Al). By way of example, the intermediate region 230 could comprise a recombination layer comprising a layer of ITO.

Figure 6C:
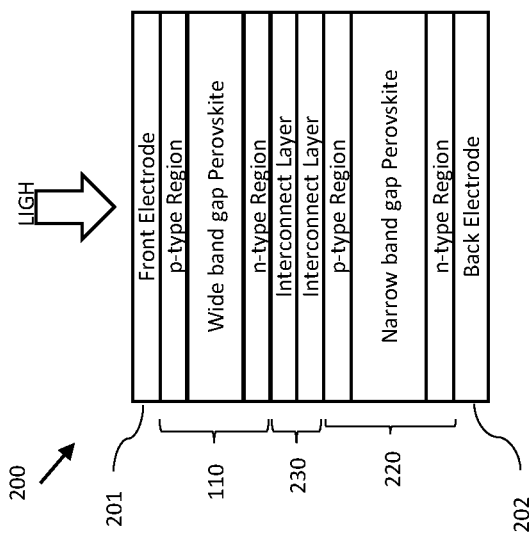
FIG. 6c illustrates schematically an exemplary perovskite-based tandem photovoltaic device having a bottom sub-cell comprising a second photosensitive/light absorbing perovskite material.
Figure 6B:
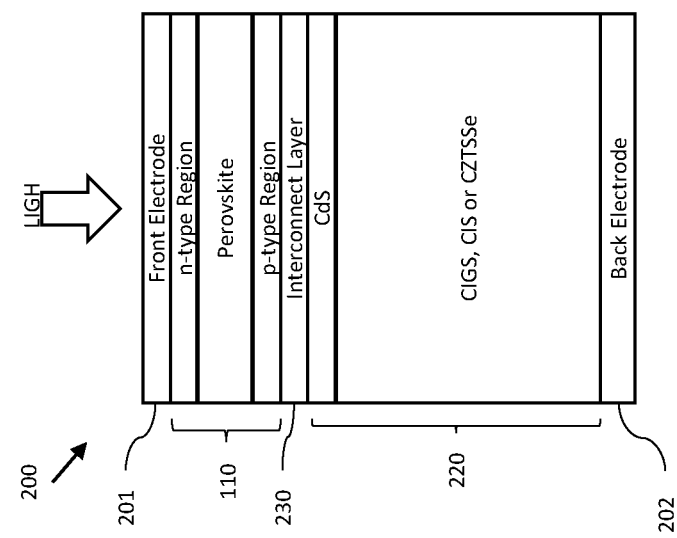
FIG. 6b illustrates schematically an exemplary perovskite-based tandem photovoltaic device having a CIGS, CIS, or CZTSSe bottom sub-cell.
Figure 6A:
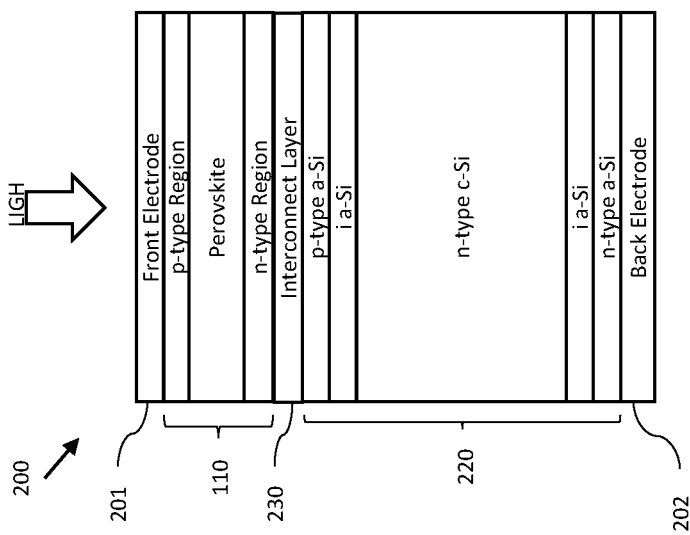
FIG. 6a illustrates schematically an exemplary perovskite-based tandem photovoltaic device having a crystalline silicon bottom sub-cell.

FIGS. 6a to 6c illustrate some further exemplary embodiments of multi-junction photovoltaic devices having a first sub-cell comprising a photoactive perovskite material of general formula (I) and one or more further sub-cells. In particular, FIG. 6a illustrates an example of a tandem photovoltaic device, wherein the top/upper/first sub-cell comprises a photosensitive/light absorbing perovskite material and the bottom/lower/second sub-cell comprises a crystalline silicon sub-cell. In this exemplary embodiment, the crystalline silicon sub-cell comprises an amorphous silicon/crystalline silicon heterojunction (SHJ) that makes use of a crystalline silicon (c-Si) wafer as a photoactive absorber and amorphous silicon (a-Si) thin-films for junction formation and surface passivation. The crystalline silicon sub-cell comprises a p-type a-Si emitter, an intrinsic a-Si passivation/buffer layer, an n-type c-Si photoactive absorber, another intrinsic a-Si passivation/buffer layer, and a back-surface field (BSF) layer made of n-type a-Si.

FIG. 6b illustrates an example of a tandem photovoltaic device, wherein the top/upper/first sub-cell comprises a photosensitive/light absorbing perovskite material and the bottom/lower/second sub-cell comprises a CIGS, CIS, or CZTSSe sub-cell. In this exemplary embodiment, the bottom sub-cell comprises a (p-type) CIGS, CIS, or CZTSSe photoactive absorber and a (n-type) CdS buffer layer.

FIG. 6c illustrates an example of a tandem photovoltaic device, wherein the top/upper/first sub-cell comprises a photosensitive/light absorbing perovskite material and the bottom/lower/second sub-cell comprises a second photosensitive/light absorbing perovskite material.

In the above described photovoltaic devices, the n-type region comprises one or more n-type layers. Often, the n-type region is an n-type layer, i.e. a single n-type layer. In other embodiments, however, the n-type region may comprise an n-type layer and a separate n-type exciton blocking layer or hole blocking layer.

An exciton blocking layer is a material which is of wider band gap than the photoactive material, but has either its conduction band or valance band closely matched with those of the photoactive material. If the conduction band (or lowest unoccupied molecular orbital energy levels) of the exciton blocking layer are closely aligned with the conduction band of the photoactive material, then electrons can pass from the photoactive material into and through the exciton blocking layer, or through the exciton blocking layer and into the photoactive material, and we term this an n-type exciton blocking layer. An example of such is bathocuproine (BCP), as described in P. Peumans, A. Yakimov, and S. R. Forrest, "Small molecular weight organic thin-film photodetectors and solar cells" J. Appl. Phys. 93, 3693 (2001) and Masaya Hirade, and Chihaya Adachi, "Small molecular organic photovoltaic cells with exciton blocking layer at anode interface for improved device performance" Appl. Phys. Lett. 99, 153302 (2011)}.

An n-type layer is a layer of an electron-transporting (i.e. an n-type) material. An n-type material may be a single n-type compound or elemental material, or a mixture of two or more n-type compounds or elemental materials, which may be undoped or doped with one or more dopant elements. An n-type layer may comprise an inorganic or an organic n-type material.

A suitable inorganic n-type material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. Typically, the n-type material is selected from a metal oxide, a metal sulphide, a metal selenide, and a metal telluride. Thus, the n-type material may comprise an inorganic material selected from oxide of titanium, tin, zinc, niobium, tantalum, tungsten, indium, gallium, neodymium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals.

Examples of other semiconductors that may be suitable n-type materials, for instance if they are n-doped, include group IV elemental or compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide).

Other n-type materials may also be employed, including organic and polymeric electron transporting materials, and electrolytes. Suitable examples include, but are not limited to, a fullerene or a fullerene derivative, an organic electron transporting material comprising perylene or a derivative thereof, or poly{[N,N0-bis(2-octyldodecyl)-naphthalene-1, 4,5,8-bis(dicarboximide)-2,6-diyl]-alt-5,50-(2,20-bithiophene)} (P(NDI2OD-T2)).

In the above described photovoltaic devices, the p-type region comprises one or more p-type layers. Often, the p-type region is a p-type layer, i.e. a single p-type layer. In other embodiments, however, the p-type region may comprise a p-type layer and a p-type exciton blocking layer or electron blocking layer. If the valence band (or highest occupied molecular orbital energy levels) of the exciton blocking layer is closely aligned with the valence band of the photoactive material, then holes can pass from the photoactive material into and through the exciton blocking layer, or through the exciton blocking layer and into the photoactive material, and we term this a p-type exciton blocking layer. An example of such is tris[4-(5-phenylthiophen-2-yl) phenyl]amine, as described in Masaya Hirade, and Chihaya Adachi, "Small molecular organic photovoltaic cells with exciton blocking layer at anode interface for improved device performance" Appl. Phys. Lett. 99, 153302 (2011).

A p-type layer is a layer of a hole-transporting (i.e. a p-type) material. The p-type material may be a single p-type compound or elemental material, or a mixture of two or more p-type compounds or elemental materials, which may be undoped or doped with one or more dopant elements. A p-type layer may comprise an inorganic or an organic p-type material.

Suitable p-type materials may be selected from polymeric or molecular hole transporters. Suitable p-type materials include molecular hole transporters, polymeric hole transporters and copolymer hole transporters. A p-type material may for instance be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Thus, a p-type material employed in the photovoltaic device of the invention may for instance comprise any of the aforementioned molecular hole transporting materials, polymers or copolymers. In one embodiment, the p-type regions comprises a hole transport material.

A p-type layer of the photovoltaic device may comprise spiro-OMeTAD (2,2',7,7'-tetrakis-(N,N-di-p-methoxyphenylamine)-9,9'-spirobifluorene)), P3HT (poly(3-hexylthiophene)), PCPDTBT (Poly[2,1,3-benzothiadiazole-4,7-diyl [4,4-bis(2-ethylhexyl)-4H-cyclopenta[2,1-b:3,4-b'] dithiophene-2,6-diyl]]), PVK (poly(N-vinylcarbazole)), poly(3-hexylthiophene), poly[N,N-diphenyl-4-methoxyphenylamine-4',4"-diyl], sexithiophene, 9,10-bis(phenylethynyl)anthracene, 5,12-bis(phenylethynyl)naphthacene, diindenoperylene, 9,10-diphenylanthracene, PEDOT-TMA, PEDOT:PSS, perfluoropentacene, perylene, poly(pphenylene oxide), poly(p-phenylene sulfide), quinacridone, rubrene, 4-(dimethylamino)benzaldehyde diphenylhydrazone, 4-(dibenzylamino)benzaldehyde-N, Ndiphenylhydrazone or phthalocyanines.

Depending upon the specific arrangement of any of the photoactive devices described above, the thickness of the photoactive region is typically from 300 nm to 3000 nm. Usually, the thickness of the photoactive region is from 400 nm to 2000 nm. For instance the thickness may be from 500 nm to 1500 nm.

The layer of perovskite material preferably comprises a thin film of the perovskite material. In this regard, in order to provide highly efficient photovoltaic devices, the absorption of the absorber should ideally be maximised so as to generate an optimal amount of current. Consequently, when using a perovskite as the absorber in a photovoltaic device, the thickness of the perovskite layer should ideally be in the order of from 300 to 600 nm, in order to absorb most of the sun light across the visible spectrum. In particular, in a solar cell the perovskite layer should generally be thicker than the absorption depth (which is defined as the thickness of film required to absorb 90% of the incident light of a given wavelength, which for the perovskite materials of interest is typically above 100 nm if significant light absorption is required across the whole visible spectrum (400 to 800 nm)), as the use of a photoactive layer in photovoltaic devices with a thickness of less than 100 nm can be detrimental to the performance of the device.

Typically, therefore, the thickness of the layer of the perovskite material is between 50 nm and 2 μm. The thickness of the layer of the perovskite material in the photovoltaic device may for instance be from 100 nm to 1000 nm. The thickness of the layer of the perovskite material in the photovoltaic device may for instance be from 200 nm to 700 nm, and is preferably from 300 nm to 600 nm.

In the above described photovoltaic devices, the front electrode may have a thickness of from 100 nm to 700 nm, for instance of from 100 nm to 400 nm. For instance the thickness may be 400 nm. The back electrode may have a thickness of from 10 nm to 500 nm, for instance from 50 nm to 200 nm. For instance, the thickness of the back electrode may be 150 nm.

The n-type region may have a thickness of from 50 nm to 1000 nm. For instance, the n-type region may have a thickness of from 50 nm to 500 nm, or from 100 nm to 500 nm. Where the n-type region comprises a compact layer of an n-type semiconductor, the compact layer has a thickness of from 50 nm to 200 nm, typically of about 100 nm.

The p-type region may have a thickness of from 50 nm to 1000 nm. For instance, the p-type region may have a thickness of from 50 nm to 500 nm, or from 100 nm to 500 nm.

Where the photoactive region comprises a porous scaffold material, the thickness of the layer of the porous scaffold material may have a thickness of from 5 nm to 500 nm, or from 100 nm to 300 nm. For instance, the thickness of the layer of the porous scaffold may be from 10 nm to 50 nm.

Where the photoactive region comprises a capping layer of the perovskite material over a porous region, the thickness of the capping layer can be greater than, equal to, or less than the thickness of the porous region. The thickness of the capping layer is typically from 10 nm to 1000 nm, or for instance from 100 nm to 700 nm. A capping layer having a thickness of at least 100 nm is usually preferred. The thickness of the porous region is often from 5 nm to 1000 nm. More typically, it is from 5 nm to 500 nm, or for instance from 30 nm to 200 nm.

FIGS. 7a and 7b Illustrate schematically close-up views of exemplary embodiments of multi-junction photovoltaic devices in which a conformal layer of photoactive perovskite material has been deposited onto a rough or textured surface in accordance with the methods described herein.

FIG. 7a illustrates schematically the textured/rough top surface 221 of a further sub-cell 220 that is immediately below the first sub-cell 210 that comprises a perovskite material 113 of general formula (I). Depending upon whether device has a regular or inverted structure, a conformal n-type region 111 or p-type region 112 is deposited onto the textured/rough top surface 221 of the further photoactive region 220. The layer of the perovskite material 113 is then deposited onto the rough/textured surface presented by the conformal n-type region 111 or p-type region 112 present on the textured/rough top surface of the further sub-cell 220.

FIG. 7b illustrates schematically the textured/rough top surface 221 of the further sub-cell 220 that is immediately below the first sub-cell 210 that comprises a perovskite material 113 of general formula (I). In this device the further sub-cell 220 is separated from first sub-cell 210 by a conformal intermediate region 230 that is deposited onto the textured/rough top surface 221 of the further sub-cell 220. Depending upon whether device has a regular or inverted structure, a conformal n-type region 111 or p-type region 112 is then deposited onto the top surface of the conformal intermediate region 230 (which is itself rough due to being conformal with the textured/rough top surface 221 of the further sub-cell 220). The layer of the perovskite material 113 is then deposited onto the rough/textured surface presented by the conformal n-type region 111 or p-type region 112 present on the top surface of the conformal intermediate region 230.

In a multi-junction photovoltaic device, the thickness of an intermediate region 230 that connects a first sub-cell 210 to an adjacent second sub-cell is typically 50 nm or less. Consequently, the one or more layers that make up the intermediate region 230 must generally conform with the surface of the second sub-cell on which they are disposed, with only a negligible smoothening effect on the surface profile of the second sub-cell.

The surface roughness/profile of the further sub-cell 220 that is immediately below the first sub-cell 210 can be provided by the surface roughness and/or texturing of one of the photoactive layers of the further sub-cell 220. By way example, in the amorphous silicon/crystalline silicon heterojunction (SHJ) illustrated in FIG. 6a the crystalline silicon layer can be provided with a textured top surface (e.g. to reduce reflection) having a root mean square roughness ($R_{rms}$) of between 10 µm and 20 µm. The amorphous silicon layers (i and p) above the crystalline silicon layer will then be thin relative to this crystalline silicon layer and will therefore need to conform to the texturing of the top surface. By way of further example, in the tandem device illustrated in FIG. 6b the CIGS, CIS or CZTSSe photo absorber layer can be formed with a surface roughness (e.g. to scatter light into the absorber layer). The CdS buffer layer above the CZTSSe photo absorber layer will then be thin relative to this CZTSSe layer and will therefore need to conform to the rough top surface. Alternatively, a buffer layer or window layer can be provided within the further sub-cell 220 that is immediately below the first sub-cell 210, and this buffer layer or window layer can be formed with a surface roughness such that the top surface of the further sub-cell 220 presents a rough surface to the first sub-cell 210. Hüpkes, J., Pust, S. & Böttler, W., 2009. Light scattering and trapping in different thin film photovoltaic device. Proceeding of the 24th EU Photovoltaic Solar Energy Conference, p. 2766-2769 (September), pp. 2766-2769. discloses some exemplary values for the surface roughness of some conventional photoactive layers (e.g. poly-Si, CIGS etc) and some conventional surface textured films used for light trapping in photovoltaic devices, with the measured RMS roughness ($R_q$) being between 65 nm and 240 nm.

Method of Producing a Photovoltaic Device

There is also provided a method of producing a photovoltaic device comprising a photoactive region that comprises a perovskite material, wherein the layer of perovskite material is disposed on a surface that has a roughness average ($R_a$) or root mean square roughness ($R_{rms}$) of greater than or equal to 50 nm. In this regard, the method comprises using vapour deposition to deposit a substantially continuous and conformal solid layer comprising one or more initial/primary precursor compounds of the perovskite material on to the rough surface and subsequently treating the solid layer of the one or more initial precursor compounds with one or more further/secondary precursor compounds. The treatment of the solid layer comprising one or more initial precursor compounds with one or further precursor compounds thereby causes the one or more initial precursor compounds and the one or further precursor compounds to react and form a substantially continuous and conformal solid layer of the perovskite material on the rough surface. The step of treating the solid layer comprising the one or more initial precursor compounds preferably comprises using solution deposition to treat the solid layer comprising the one or more initial precursor compounds with a solution comprising the one or more further precursor compounds. Alternatively, the step of treating the solid layer comprising the one or more initial precursor compounds comprises using vapour deposition to treat the solid layer comprising the one or more initial precursor compounds with the one or more further precursor compounds.

As detailed above, the layer of perovskite material preferably comprises a thin film of the perovskite material. The thickness of the thin film of the perovskite material is therefore typically from 50 nm to 2 µm, is often from 100 nm to 1000 nm, and is preferably from 200 nm to 700 nm.

The roughness of the surface on to which the perovskite material is deposited will depend upon the specific structure of the photovoltaic device. In particular, for multi-junction devices, the roughness of the surface is defined/determined by the roughness and/or texturing present on the top surface of the sub-cell that is immediately beneath the perovskite material within device, as illustrated in FIGS. 7a and 7b. By way of example only, the pyramid features present on textured solar cell, such as a textured silicon cell, typically range in height from 50 nm to 30 µm, are more typically between 500 nm and 20 µm, and are often in the range of 1 µm to 10 µm. Consequently, the surface on to which the perovskite material is deposited can have a roughness average ($R_a$) or root mean square roughness ($R_{rms}$) from 50 nm to 30 µm, more typically from 500 nm to 20 µm, and often from 1 µm to 10 µm.

As detailed above, the perovskite material preferably comprises a perovskite of the general formula (I)

$$[A][B][X]_3 \qquad (I)$$

wherein [A] is at least one monovalent cation, [B] is at least one divalent inorganic cation, and [X] is at least one halide anion.

[X] preferably comprises at least one halide anion selected from fluoride, chloride, bromide, and iodide, and preferably selected from bromide and iodide. In particular, [X] typically comprises two different halide anions selected from fluoride, chloride, bromide, and iodide, and preferably comprises bromide and iodide. For example, [X] may comprise iodide and bromide in a ratio 3-y:y of iodide to bromide, wherein 0<y<3.

[A] preferably comprises at least one organic cation selected from methylammonium ($CH_3NH_3^+$), formamidinium ($HC(NH_2)_2^+$), and ethyl ammonium ($CH_3CH_2NH_3^+$). Alternatively, or in addition, [A] may comprise at least one inorganic cation selected from $Cs^+$, $Rb^+$, $Cu^+$, $Pd^+$, $Pt^+$, $Ag^+$, $Au^+$, $Rh^+$, and $Ru^+$, and preferably selected from $Cs^+$ and $Rb^+$, and more preferably $Cs^+$. [A] may therefore comprise an organic cation (A) and an inorganic cation (A') in a ratio 1-x:x of the organic cation (A) to the inorganic cation (A'), wherein 0<x<1.

[B] preferably comprises at least one divalent inorganic cation selected from $Pb^{2+}$ and $Sn^{2+}$, and more preferably comprises a lead (II) cation ($Pb^{2+}$).

In one embodiment, each of the one or more initial precursor compounds comprises one of the one or more divalent inorganic cations [B] and each of the one or more further precursor compounds comprises one of the one or more monovalent cations [A]. By way of example, when [B] comprises a first divalent inorganic cation B and a second divalent inorganic cation B', the one or more initial precursor compounds typically comprise at least a first initial precursor compound comprising the first divalent inorganic cation B and a second initial precursor compound comprising the second divalent inorganic cation B. By way of further example, when [B] comprises/consists of a divalent inorganic cation B, the one or more initial precursor compounds typically comprise at least one initial precursor compound comprising the divalent inorganic cation B. As a further example, when [A] comprises a first monovalent cation A and a second monovalent cation A', the one or more further precursor compounds typically comprise at least a first further precursor compound comprising the first monovalent cation A and a second further precursor compound comprising the second monovalent cation A. In a yet further example, when [A] comprises/consists of a monovalent cation A, the one or more further precursor compounds typically comprise at least one further precursor compound comprising the first monovalent cation A.

Each of the one or more first precursor compounds and each of the one or more second precursor compounds may then further comprise one of the one or more halide anions [X]. By way of example, when [X] comprises a first halide anion X and a second halide anion X', at least one of the one or more initial precursor compounds comprises one of the first halide anion X and the second halide anion X' and at least one of the one or more further precursor compounds comprises the other of the first halide anion X and a second halide anion X'.

In a more detailed example, when [B] comprises/consists of a divalent inorganic cation B, and [X] comprises a first halide anion X and a second halide anion X', then the one or more initial precursor compounds can comprise one or both of:
i) an initial precursor compound comprising the divalent inorganic cation B and the first halide anion X (i.e. $BX_2$); and
ii) an initial precursor compound comprising the divalent inorganic cation B and the second halide anion X' (i.e. $BX'_2$).

Similarly, when [A] comprises a first monovalent cation A and a second monovalent cation A' and [X] comprises a first halide anion X and a second halide anion X', then the one or more further precursor compounds can comprise one or more of:

i) a further precursor compound comprising the first monovalent cation A and the first halide anion X (i.e. AX);
ii) a further precursor compound comprising the first monovalent cation A and the second halide anion X (i.e. AX');
iii) a further precursor compound comprising the second monovalent cation A' and the first halide anion X (i.e. A'X); and
iv) a further precursor compound comprising the second monovalent cation A' and the second halide anion X' (i.e. A'X').

In another embodiment, when [A] comprises one or more inorganic cations, then each of the one or more initial precursor compounds may comprises one of the one or more monovalent inorganic cations [A] and each of the one or more further precursor compounds comprises one of the one or more divalent inorganic cations [B]. By way of example, in this embodiment, when [A] comprises a first monovalent inorganic cation A and a second monovalent inorganic cation A', the one or more initial precursor compounds typically comprise at least a first initial precursor compound comprising the first monovalent inorganic cation A and a second initial precursor compound comprising the second monovalent inorganic cation A. By way of further example of this embodiment, when [A] comprises/consists of a monovalent inorganic cation A, the one or more initial precursor compounds typically comprise at least one initial precursor compound comprising the first monovalent cation A. As a further example of this embodiment, when [B] comprises a first divalent inorganic cation B and a second divalent inorganic cation B', the one or more further precursor compounds typically comprise at least a first further precursor compound comprising the first divalent inorganic cation B and a second further precursor compound comprising the second divalent inorganic cation B. As a yet further example of this embodiment, when [B] comprises/consists of a divalent inorganic cation B, the one or more further precursor compounds comprise at least an initial precursor compound comprising the divalent inorganic cation B.

Each of the one or more first precursor compounds and each of the one or more second precursor compounds may then further comprise one of the one or more halide anions [X]. By way of example, when [X] comprises a first halide anion X and a second halide anion X', at least one of the one or more initial precursor compounds comprises one of the first halide anion X and the second halide anion X' and at least one of the one or more further precursor compounds comprises the other of the first halide anion X and a second halide anion X'.

In a more detailed example of this embodiment, when [A] comprises a first monovalent cation A and a second monovalent cation A' and [X] comprises a first halide anion X and a second halide anion X', then the one or more initial precursor compounds can comprise one or more of:
i) an initial precursor compound comprising the first monovalent cation A and the first halide anion X (i.e. AX);
ii) an initial precursor compound comprising the first monovalent cation A and the second halide anion X (i.e. AX');
iii) an initial precursor compound comprising the second monovalent cation A' and the first halide anion X (i.e. A'X); and
iv) an initial precursor compound comprising the second monovalent cation A' and the second halide anion X' (i.e. A'X').

Similarly, when [B] comprises/consists of a divalent inorganic cation B, and [X] comprises a first halide anion X and a second halide anion X', then the one or more further precursor compounds can comprise one or both of:
  i) a further precursor compound comprising the divalent inorganic cation B and the first halide anion X (i.e. $BX_2$); and
  ii) a further precursor compound comprising the divalent inorganic cation B and the second halide anion X' (i.e. $BX'_2$).

Expanding upon the two embodiments outline above, in a specific example, when the perovskite material comprises a single monovalent cation A, a single divalent inorganic cation B, and a single halide anion X, the initial precursor compounds will typically comprise one of (i) a compound comprising the divalent inorganic cation B and the halide anion X and (ii) a compound comprising the monovalent cation A and the halide anion X. The further precursor compound will then comprise the other of (i) a compound comprising the divalent inorganic cation B and the halide anion X and (ii) a compound comprising the monovalent cation A and the halide anion X.

In this case, the compound comprising the divalent inorganic cation B and the halide anion X is a compound of formula $BX_2$, wherein B is the divalent inorganic cation and X is the halide anion; and the compound comprising the monovalent cation A and the halide anion X is a compound of formula AX, wherein A is the monovalent cation and X is the halide anion.

If the monovalent cation A is an organic cation, then the initial precursor compound preferably comprises the divalent inorganic cation B and the halide anion X and the further precursor compound will then comprise the monovalent organic cation A and the halide anion X. However, if the monovalent cation A is an inorganic cation, then the initial precursor compound can comprise either of (i) a compound comprising the divalent inorganic cation B and the halide anion X and (ii) a compound comprising the monovalent inorganic cation A and the halide anion X. The further precursor compound will then comprise the other of (i) a compound comprising the divalent inorganic cation B and the halide anion X and (ii) a compound comprising the monovalent inorganic cation A and the halide anion X.

In the above described embodiments, the step of using vapour deposition to deposit a substantially continuous and conformal solid layer comprising the one or more initial precursor compounds of the perovskite material on the rough surface can comprise using vapour deposition to deposit on to the rough surface a substantially continuous and conformal solid layer comprising inorganic material, and subsequently treating the solid layer of the inorganic material with a gas of a halide X and thereby reacting the inorganic material and the halide to form a substantially continuous and conformal solid layer comprising the one or more initial precursor compounds on the rough surface.

This approach can be used when each of the one or more initial precursor compounds comprises one of the one or more divalent inorganic cations [B]. The inorganic material deposited on to the rough surface using vapour deposition will then comprise inorganic material from which the one or more divalent inorganic cations [B] are formed. By way of example, when [B] comprises/consists of a divalent inorganic cation B, the solid layer of inorganic material will comprise atoms which the divalent inorganic cation B can be formed. In a more specific example, when [B] comprises/consists of lead (II) cations ($Pb^{2+}$), the solid layer of inorganic material will comprise a solid layer of lead (Pb).

This approach can also be used when the one or more monovalent cations [A] comprise one or more inorganic cations, and each of the one or more initial precursor compounds comprises one of the one or more monovalent inorganic cations. The inorganic material deposited on to the rough surface using vapour deposition will then comprise inorganic material from which the one or more monovalent inorganic cations are formed. By way of example, when [A] comprises/consists of a monovalent inorganic cation A, the solid layer of inorganic material will comprise atoms which the monovalent inorganic cation can be formed. In a more specific example, when [A] comprises/consists of caesium cations ($Cs^+$), the solid layer of inorganic material will comprise a solid layer of caesium (Cs).

The band gap of the perovskite material is preferably from 1.10 eV to 2.30 eV, and is preferably from 1.65 eV to 1.75 eV.

As described above, the photovoltaic device may have a multi-junction structure comprising a first sub-cell disposed over a second sub-cell, the first sub-cell comprising the photoactive region comprising the perovskite material. In this case, an adjacent surface of the second sub-cell will then have a roughness average ($R_a$) or root mean square roughness ($R_{rms}$) of greater than or equal to 50 nm, and the rough surface on which the layer of perovskite material is disposed will be a surface that conforms to the rough surface of the second sub-cell. For example, the rough surface of the second sub-cell can comprise a surface within the second sub-cell that is provided with a surface texture. Such surface textures typically comprise one of pyramids and inverted pyramids.

The surface on which the solid layer of perovskite material is deposited may then be any one of an adjacent surface of the second sub-cell, and an adjacent surface of a layer that is disposed between the solid layer of perovskite material and the second sub-cell and that conforms to the rough surface of the second sub-cell.

The solid layer of perovskite material may be separated from the second sub-cell by one or more layers that each substantially conform to the rough surface of the second sub-cell. The one or more layers that separate the solid layer of perovskite material from the second sub-cell and that each substantially conform to the rough surface of the second sub-cell typically comprise any of a charge transporting layer of the photoactive region of the first sub-cell, and one or more interconnect layers disposed between and connecting the first sub-cell and the second sub-cell. The surface on which the solid layer of perovskite material is disposed then comprises either an adjacent surface of a charge transporting layer of the photoactive region of the first sub-cell or an adjacent surface of an interconnect layer disposed between and connecting the first sub-cell and the second sub-cell.

The second sub-cell can comprise any of a second perovskite material, crystalline silicon, CdTe, CuZnSnSSe, CuZnSnS, or CuInGaSe (CIGS). In particular, the second sub-cell can comprise a crystalline silicon sub-cell. Such a crystalline silicon sub-cell preferably comprises a silicon heterojunction (SHJ), and more preferably the crystalline silicon sub-cell comprises an amorphous silicon:crystalline silicon heterojunction. Alternatively, the second sub-cell can comprise a polycrystalline silicon sub-cell.

Figure 8B:
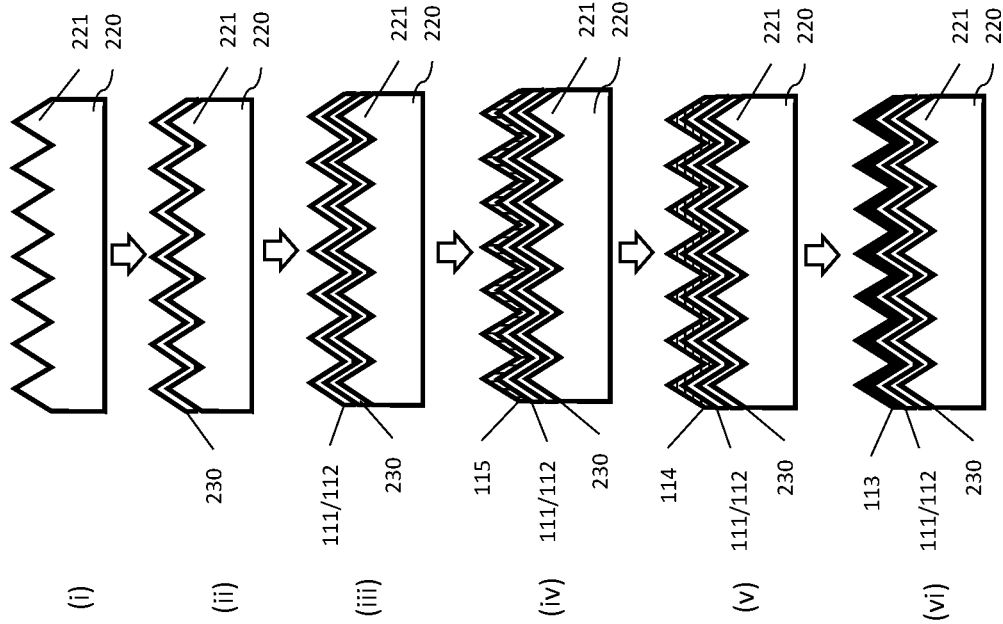
FIG. 8b illustrates schematically an alternative exemplary embodiment of a method of producing a photovoltaic device as described herein.
Figure 8A:
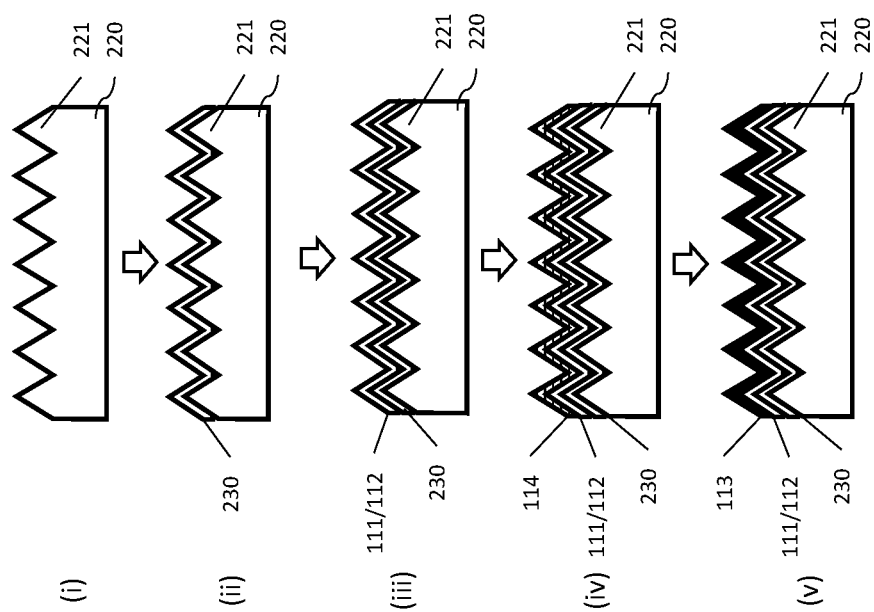
FIG. 8a illustrates schematically an exemplary embodiment of a method of producing a photovoltaic device as described herein.

FIGS. 8a and 8b illustrate schematically exemplary embodiments of the method of producing a photovoltaic device as described above.

FIG. 8a illustrates an exemplary embodiment in which a substantially continuous and conformal solid layer comprising the one or more initial precursor compounds of the perovskite material is deposited on to on the rough surface by vapour deposition. In contrast, FIG. 8b illustrates an exemplary embodiment in which a substantially continuous and conformal solid layer comprising inorganic material is deposited on to the rough surface by vapour deposition, and this layer comprising inorganic material is then treated with a hailde gas to convert the inorganic material into a solid layer comprising one or more initial precursor compounds of the perovskite material.

In step (i) of FIG. 8a, a second sub-cell 220 is provided that has a textured/rough top surface 221. In optional step (ii), an intermediate region 230 comprising one or more conformal interconnect layers can then be deposited onto the top surface 221 of the second sub-cell 220. In step (iii), one or more conformal layers of charge transporting material (i.e. one or more n-type layers or p-type layers) are then deposited onto either the top surface 221 of the second sub-cell 220 or, if present, the conformal intermediate region 230. In step (iv) a substantially continuous and conformal solid layer comprising the one or more initial precursor compounds of the perovskite material 114 is deposited on to on the rough surface by vapour deposition. In step (v), the solid layer comprising one or more initial precursor compounds 114 is then treated with one or more further precursor compounds which react together to form a substantially continuous and conformal solid layer of the perovskite material 113 over the rough surface 221.

In FIG. 8b, step (i), optional step (ii), and step (iii) as the same as steps (i) to (iii) of FIG. 8a. However, in step (iv) of FIG. 8b a substantially continuous and conformal solid layer comprising inorganic material 115 is deposited on over the rough surface by vapour deposition. In step (v) the layer comprising inorganic material 115 is then treated with a halide gas to convert the inorganic material into a solid layer comprising one or more initial precursor compounds of the perovskite material 114. In step (vi), the solid layer comprising one or more initial precursor compounds 114 is then treated with one or more further precursor compounds which react together to form a substantially continuous and conformal solid layer of the perovskite material 113 over the rough surface 221.

In FIGS. 8a and 8b, the step of treating the solid layer comprising the one or more initial precursor compounds 114 (steps (v) and (vi) respectively) preferably comprises using solution deposition to treat the solid layer comprising the one or more initial precursor compounds with a solution comprising the one or more further precursor compounds. Alternatively, the step of treating the solid layer comprising the one or more initial precursor compounds 114 (steps (v) and (vi) respectively) comprises using vapour deposition to treat the solid layer comprising the one or more initial precursor compounds with the one or more further precursor compounds.

EXAMPLES

Figure 9:
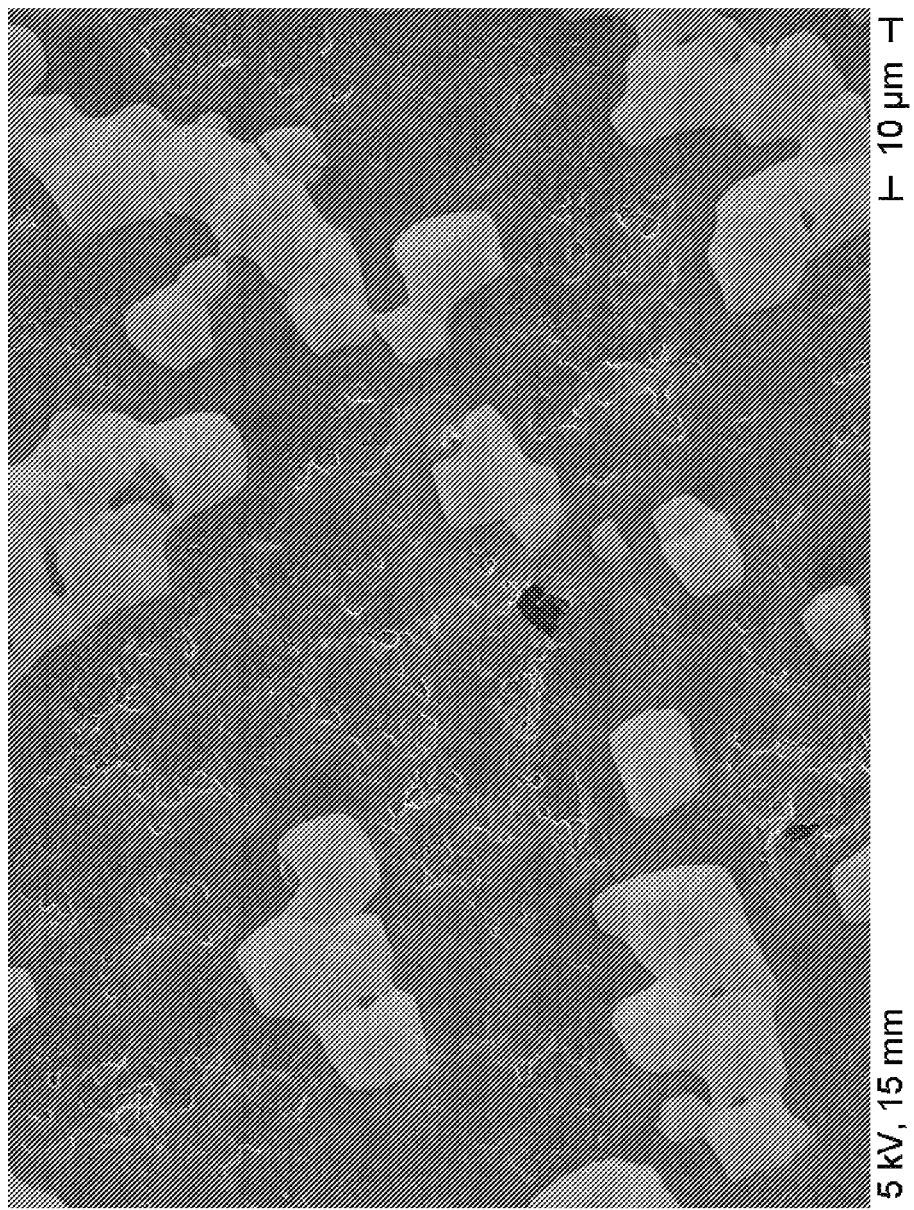
FIG. 9 is an SEM image of a layer of perovskite material deposited over a textured Si substrate using conventional methods.

FIG. 9 is a plan view SEM image of a textured Si substrate that has been coated with an ITO intermediate layer by sputtering and then with a layer of perovskite material of formula $MAPbI_{2.4}Br_{0.6}$ (wherein MA is methyl ammonium) deposited on the conformal ITO layer using a typical spin coating solution process. In the image the light grey areas are regions of exposed ITO that project through the layer of perovskite material (shown in dark grey).

Figure 10:
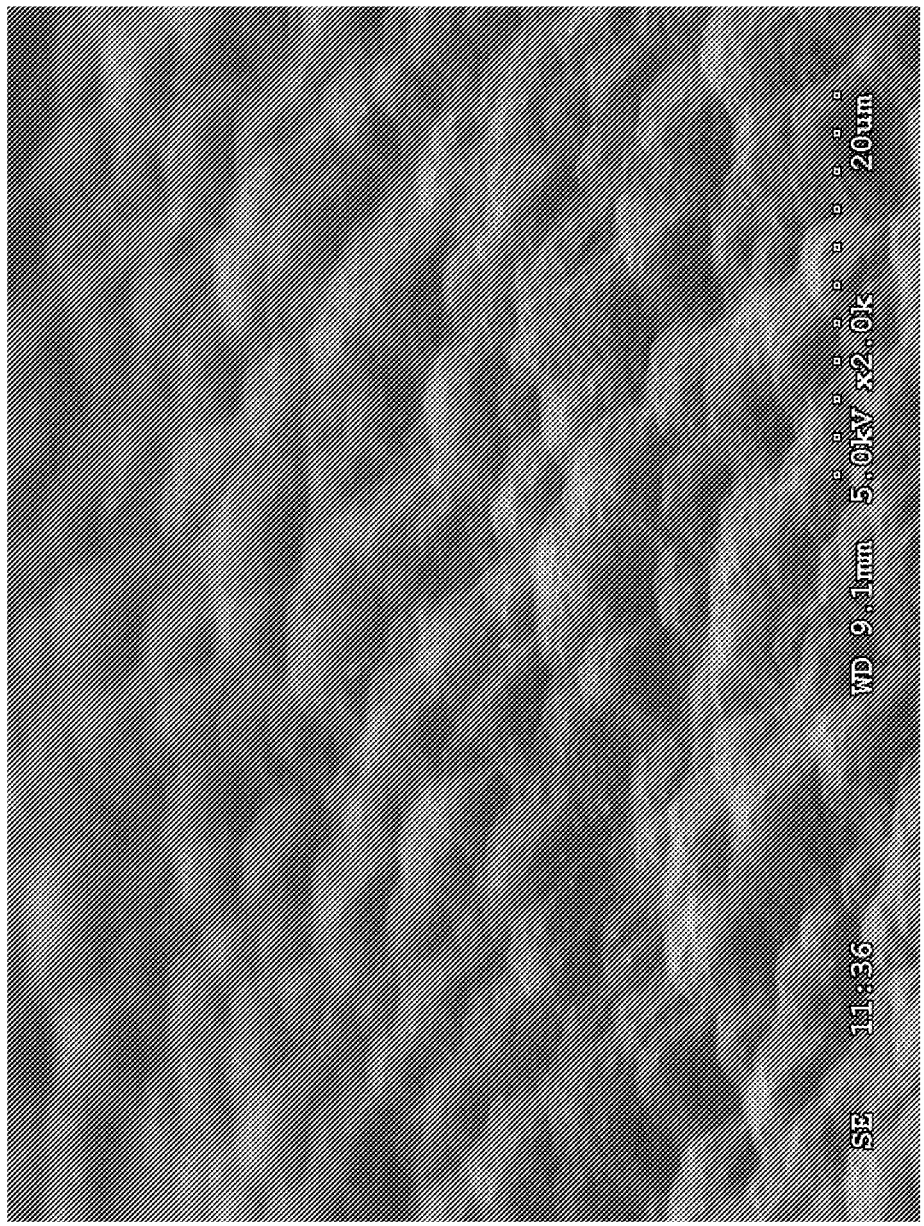
FIG. 10 is an SEM image of a layer of perovskite material deposited over a textured Si substrate using the methods described herein.

For comparison, FIG. 10 is a 45° SEM image of a textured Si substrate that has been coated with an ITO intermediate layer by sputtering and then with a layer of perovskite material of formula $MAPbI_3$ (wherein MA is methyl ammonium) deposited using the methods described above. In particular, the layer of $MAPbI_3$ was produced by vapour deposition of a layer of $PbI_2$ followed by conversion by treatment with a solution of MAI. From this image it can be seen that there are no regions of exposed ITO (no light grey areas) and that the layer of perovskite material (shown in dark grey) has a surface profile that substantially conforms to that of the conformal ITO intermediate layer.

It will be appreciated that individual items described above may be used on their own or in combination with other items shown in the drawings or described in the description and that items mentioned in the same passage as each other or the same drawing as each other need not be used in combination with each other.

Furthermore, although the invention has been described in terms of preferred embodiments as set forth above, it should be understood that these embodiments are illustrative only. Those skilled in the art will be able to make modifications and alternatives in view of the disclosure which are contemplated as falling within the scope of the appended claims. For example, those skilled in the art will appreciate that whilst the above-described specific embodiments of the invention all relate to photovoltaic devices having a multi-junction structure, aspects of the invention are equally applicable to single junction devices in which a layer of a photoactive perovskite needs to be deposited onto a relatively rough surface. By way of further example, those skilled in the art will appreciate that whilst the above-described embodiments of the invention all relate to photovoltaic devices, aspects of the invention may be equally applicable to other optoelectronic devices. In this regard, the term "optoelectronic devices" includes photovoltaic devices, photodiodes (including solar cells), phototransistors, photomultipliers, photoresistors, and light emitting diodes etc. In particular, whilst in the above-described embodiments the photoactive perovskite material is used as a light absorber/photosensitizer, it may also function as light emitting material by accepting charge, both electrons and holes, which subsequently recombine and emit light. In addition, those skilled in the art will appreciate that whilst the above-described embodiments of the invention all relate to perovskite materials, aspects of the invention may be equally applicable to other three-dimensional crystalline materials. By way of example, aspects of the invention may be equally applicable to perovskite-related structures such as layered perovskites, brownmillerite structured materials (which can be represented by the general formula $A^{2+}_2B^{3+}_2X^{2-}_5$), hollandite structured materials (which can be represented by the general formula $A_{2-y}B_{8-z}X_{16}$, spinels (which can be represented by the general formula $A^{2+}B^{3+}_2X^{2-}_4$) inverse spinels (which can be represented by the formula $B^{3+}(A^{2+}B^{3+})X^{2-}_4$), olivines (which can be represented by the formula $A^{2+}_2B^{4+}X^{2-}_4$) etc.

The invention claimed is:

1. A method of producing a photovoltaic device, the photovoltaic device comprising a photoactive region comprising a layer of perovskite material, wherein the perovskite material comprises a perovskite of formula (I): $[A][B][X]_3$, wherein [A] comprises at least one monovalent cation, [B] comprises at least one divalent inorganic cation, and [X] comprises at least one halide ion, the method comprising forming a surface that has a roughness average ($R_a$), or root mean square roughness ($R_{rms}$) of greater than 50 nm, and wherein the rough surface comprises a surface texture comprising one of pyramids and inverted pyramids having a range in height from 500 nm to 20 μm, subsequently depositing on said surface a perovskite layer, wherein depositing the perovskite layer comprises:

using vapor deposition to deposit a substantially continuous and conformal solid layer comprising one or more initial precursor compounds of the perovskite material on the rough surface; and subsequently, using solution deposition to treat the substantially continuous and conformal solid layer with one or more further precursor compounds, wherein the one or more initial precursor compounds and the one or more further precursor compounds are selected from the group consisting of:

(i) a compound comprising a divalent inorganic cation B and a halide anion X, and (ii) a compound comprising a monovalent cation A and a halide anion X, with the proviso that:

when the one or more initial precursor compounds comprises a compound comprising a divalent inorganic cation B and a halide anion X, then the one or more further precursor compounds comprises a compound comprising a monovalent cation A and a halide anion X, and when the one or more initial precursor compounds comprise a compound comprising a monovalent cation A and a halide anion X, then the one or more further precursor compounds comprise a compound comprising a divalent inorganic cation B and a halide anion X;

thereby reacting the one or more initial precursor compounds and the one or more further precursor compounds to form a substantially continuous and conformal solid layer of the perovskite material on the rough surface, and wherein the perovskite layer has a thickness from 500 nm to 1000 nm.

2. The method according to claim 1, wherein [X] comprises two different halide anions selected from the group consisting of fluoride, chloride, bromide, and iodide.

3. The method according to claim 1, wherein [A] comprises one or more organic cations selected from the group consisting of methylammonium ($CH_3NH_3^+$), formamidinium ($HC(NH_2)_2^+$), and ethyl ammonium ($CH_3CH_2NH_3^+$).

4. The method according to claim 1, wherein [A] comprises one or more inorganic cations selected from the group consisting of $Cs^+$, $Rb^+$, $Cu^+$, $Pd^+$, $Pt^+$, $Ag^+$, $Au^+$, $Rh^+$, and $Ru^+$.

5. The method according to claim 1, wherein [B] comprises at least one divalent inorganic cation selected from the group consisting of $Pb^{2+}$ and $Sn^{2+}$.

6. The method according to claim 1, wherein each of the one or more initial precursor compounds comprises one of the one or more divalent inorganic cations [B] and each of the one or more further precursor compounds comprises one of the one or more monovalent cations [A].

7. The method according to claim 1, wherein [A] comprises one or more inorganic cations, and each of the one or more initial precursor compounds comprises one of the one or more monovalent inorganic cations [A] and each of the one or more further precursor compounds comprises one of the one or more divalent inorganic cations [B].

8. The method according to claim 1, wherein the photovoltaic device has a multi junction structure comprising a first sub-cell disposed over a second sub-cell, the first sub-cell comprising the photoactive region comprising the perovskite material.

9. The method according to claim 8, wherein an adjacent surface of the second sub-cell has a roughness average ($R_a$) or root mean square roughness ($R_{rms}$) of greater than 50 nm, and the rough surface on which the layer of perovskite material is disposed is a surface that conforms to the rough surface of the second sub-cell.

10. The method according to claim 9, wherein the rough surface of the second sub-cell comprises a surface of or within the second sub-cell that is provided with a surface texture, and the surface texture comprises one of pyramids and inverted pyramids having a range in height from 500 nm to 20 µm.

11. The method according to claim 9, wherein the surface on which the solid layer of perovskite material is disposed is any one of:

an adjacent surface of the second sub-cell; and an adjacent surface of a layer that is disposed between the solid layer of perovskite material and the second sub-cell and that conforms to the rough surface of the second sub-cell.

12. The method according to claim 11, wherein the solid layer of perovskite material is separated from the second sub-cell by one or more layers that each substantially conforms to the rough surface of the second sub-cell.

13. The method according to claim 1, wherein [A] comprises:

at least one organic cations selected from the group consisting of methylammonium ($CH_3NH_3^+$), formamidinium ($HC(NH_2)_2^+$), and ethyl ammonium ($CH_3CH_2NH_3^+$), and at least one inorganic cations selected from $Cs^+$, $Rb^+$, $Cu^+$, $Pd^+$, $Pd^+$, $Ag^+$, $Au^+$, $Rh^+$, and $Ru^+$.

14. The method of claim 1, wherein the solution deposition results in a conformal coating on the first layer, wherein the one or more further precursor compounds comprises a compound comprising a monovalent cation A and a halide anion X.

15. The method of claim 1, wherein the substantially continuous and conformal solid layer of the perovskite material is also compact.

16. The method of claim 1, wherein the height of the one of pyramids and inverted pyramids is from 1 µm to 10 µm.

* * * * *